(12) United States Patent
Okonogi et al.

(10) Patent No.: US 7,737,505 B2
(45) Date of Patent: Jun. 15, 2010

(54) SEMICONDUCTOR DEVICE AND METHOD OF FORMING THE SAME

(75) Inventors: Kensuke Okonogi, Tokyo (JP); Kiyonori Ohyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 104 days.

(21) Appl. No.: 11/859,043

(22) Filed: Sep. 21, 2007

(65) Prior Publication Data
US 2008/0230845 A1  Sep. 25, 2008

(30) Foreign Application Priority Data
Sep. 25, 2006  (JP)  .............................. 2006-259610

(51) Int. Cl.
*H01L 29/78* (2006.01)
*H01L 23/52* (2006.01)
(52) U.S. Cl. .................. 257/377; 257/374; 257/381; 257/E21.197
(58) Field of Classification Search ................. 257/202
See application file for complete search history.

(56) References Cited

U.S. PATENT DOCUMENTS

| 6,124,620 | A  | * | 9/2000 | Gardner et al. ............. 257/411 |
| 6,243,285 | B1 | * | 6/2001 | Kurth et al. ................. 365/149 |
| 6,274,489 | B1 | * | 8/2001 | Ono et al. .................... 438/659 |
| 6,858,529 | B2 | * | 2/2005 | Chung et al. ................ 438/629 |
| 7,176,533 | B2 | * | 2/2007 | Chung et al. ................ 257/377 |
| 2003/0173593 | A1 | * | 9/2003 | Miyatake et al. ........... 257/200 |
| 2004/0007737 | A1 | * | 1/2004 | Cho et al. .................... 257/328 |
| 2005/0040401 | A1 | * | 2/2005 | Yamazaki et al. ............ 257/72 |
| 2005/0095857 | A1 | * | 5/2005 | Chung et al. ................ 438/684 |

* cited by examiner

*Primary Examiner*—Leonardo Andújar
*Assistant Examiner*—William Harriston
(74) *Attorney, Agent, or Firm*—Young & Thompson

(57) ABSTRACT

A semiconductor device may include, but is not limited to, a single crystal silicon diffusion layer, a polycrystal silicon conductor, and a diffusion barrier layer. The diffusion barrier layer separates the polycrystal silicon conductor from the single crystal silicon diffusion layer. The diffusion barrier layer prevents a diffusion of at least one of silicon-interstitial and silicon-vacancy between the single crystal silicon diffusion layer and the polycrystal silicon conductor.

18 Claims, 16 Drawing Sheets

CROSS-SECTION OF SUBSTRATE
WITH UNILLUSTRATED
POLYSILICON FILM THEREON

CROSS-SECTION OF SUBSTRATE
FREE OF POLYSILICON FILM

SEMICONDUCTOR DEVICE AND METHOD OF FORMING THE SAME

BACKGROUND OF THE INVENTION

1. Field of the Invention

The present invention generally relates to a semiconductor device and a method of forming the same. More specifically, the present invention relates to a semiconductor device including a transistor that has source and drain diffusion layers, and polysilicon contact plugs that connect the source and drain diffusion layers to interconnections. Further specifically, the present invention relates to a semiconductor device which includes reduced defects that reside in one or more diffusion layers and reduced junction leakage of current.

Priority is claimed on Japanese Patent Application No. 2006-259610, filed Sep. 25, 2006, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Japanese Unexamined Patent Application, First Publication, No. 2003-17586 discloses a conventional structure of a memory cell transistor in a semiconductor memory device. FIG. 20 is a fragmentary cross sectional elevation view illustrating a conventional structure of a memory cell transistor in a semiconductor memory device, such as a DRAM. An insulating film 102 is formed in a semiconductor substrate that is not illustrated. The insulating film 102 defines active regions in the semiconductor substrate. A pair of transistors is formed in each active region. The paired transistors are commonly coupled to a bit line 101. In the active region, a p-well layer 103 and an n-channel doped layer 104 are provided. The n-channel doped layer 104 is provided over the p-well layer 103. The p-well layer 103 is given a substrate potential. The n-channel doped layer 104 determines a threshold voltage of the transistor. An n-type buried well is formed under the p-well layer 103.

Contact plugs 105 are provided, one of which is connected to the bit line 101. The contact plug 105 is made of polycrystal silicon. Gate electrodes 106 are provided in both sides of the contact plug 105. A gate insulating film 107 is provided over the n-channel doped layer 104 and under the contact plugs 105. Side spacers 108 are provided over the gate insulating film 107. Each side spacer 108 is interposed between the gate electrode 106 and the contact plug 105. N-diffusion layers 109 of a lower impurity concentration are provided in the n-channel doped layer 104. The n-diffusion layers 109 of the lower impurity concentration are separated by a channel region, over which the gate electrode 106 is positioned. The n-diffusion layer 109 of the lower impurity concentration is connected to the contact plug 105 which is further connected to the bit line 101. The other n-diffusion layers 109 of the lower impurity concentration are connected to the contact plugs 105 which are further connected to plugs 111 which are furthermore connected to capacitors 110.

The contact plug 105 of polycrystal silicon can be formed as follows. Contact holes are formed in an interlayer insulator 112. A chemical vapor deposition process is carried out to deposit a polycrystal silicon film that has a phosphorous concentration of about 2E20 cm$^{-3}$. The polycrystal silicon film fills up the contact holes. In some cases, an additional phosphorous implantation process may be carried out following to the formation of the contact holes, thereby forming phosphorus-implanted regions 100. The phosphorus-implanted regions 100 are deeper than the n-diffusion layers 109 of the lower impurity concentration, for the purpose of field relaxation. The phosphorous implantation process can be carried out in accordance with the known conventional technique. Japanese Patent No. 3212150 discloses one conventional technique for phosphorous implantation process for the field relaxation.

An interlayer insulator 113 is provided over the interlayer insulator 112 and the contact plugs 105. An interlayer insulator 114 is provided over the interlayer insulator 113 and the bit line 101 and under the capacitors 110.

The conventional cell transistor structure of FIG. 20 can be formed as follows. A set of sequential processes from the contact-hole-making process to the contact plug formation process may generally be made. FIG. 21 is a fragmentary cross sectional elevation view illustrating a conventional cell transistor structure that is included in the conventional semiconductor device of FIG. 20.

Sequential processes having been carried out before the process for forming source and drain diffusion layers is carried out will not be described. Other sequential processes to be carried out after the process for forming the bit line 101 is carried out will also not be described.

As shown in FIG. 21, after the cell transistors have been formed, a silicon oxide film is deposited by a chemical vapor deposition process. The surface of the silicon oxide film is polished and planarized by a chemical mechanical polishing process. A resist film is applied on the planarized surface of the silicon oxide film. The resist film is patterned by a lithography process, thereby forming a resist pattern. The silicon oxide film is selectively etched by a dry etching process using the resist pattern as a mask, thereby forming contact holes 116. As a result, the n-diffusion layers 109 are partially shown under the contact holes 116. In other words, the contact holes 116 are formed so that the contact holes 116 are positioned over the n-diffusion layers 109. A phosphorus implantation process is carried out at an implantation-energy of 60 keV and a dose of about 1.5E13 cm$^{-2}$ for the purpose of field relaxation.

A chemical vapor deposition process is carried out to deposit a phosphorous-doped polycrystal silicon film over the silicon oxide film and within the contact holes 116. The phosphorous-doped polycrystal silicon film is etched by an etching back process or polished by a chemical mechanical polishing process so as to leave the phosphorous-doped polycrystal silicon film only within the contact holes 116, while removing the phosphorous-doped polycrystal silicon film over the silicon oxide film. As a result, the contact plugs of phosphorous-doped polycrystal silicon film are formed in the contact holes 116.

A heat treatment is carried out at a temperature in the range of 950° C.-1050° C. for about 60 seconds in order to activate phosphorous in the contact plugs of phosphorous-doped polycrystal silicon film. One of the contact plugs is connected to the bit line. The other contact plugs are connected to the bottom electrodes of the capacitors.

The semiconductor device of FIG. 20 has the following disadvantages. H. Shirai et al., in Applied Physics Letters, Vol. 54, pp 1748-1750 (1989), reported as follows. A polycrystal silicon film is deposited on a single crystal silicon substrate. Then, a heat treatment is carried out at a temperature of at lowest 900° C. to cause crystal grain growth, thereby changing the crystalline structure of polycrystal silicon. Changing the crystalline structure of polycrystal silicon further causes absorption of silicon-interstitial in the single crystal silicon substrate under the polycrystal silicon film.

The crystal grains in polycrystal silicon have disordered crystal orientations Crystal grain boundary has irregular atomic arrangement. In contrast, regular atomic arrangement can be present inside each crystal grain. Crystal grain boundary is, in general, lower in the density of silicon atom than the inside of each crystal grain. Carrying out the heat treatment at a high temperature causes the growth of crystal grains in the polycrystal silicon film. Increasing the size of crystal grains upon the heat treatment decreases the volume density of crystal grain boundary. Silicon atoms are supplied to the crystal grain boundary, while the crystal grain is grown.

The present inventors investigated and confirmed the facts as follows. Application of a heat treatment to a polycrystal silicon film that contacts with a single crystal silicon substrate causes that silicon-interstitial in the single crystal silicon substrate is absorbed into the polycrystal silicon film. The present inventors found out that, in the process for forming cell transistors, many vacancy-type defects are generated in the vicinity of a p-n junction, while the heat treatment is carried out at a temperature in the range of 950° C.-1050° C. for about 60 seconds in order to activate phosphorous in the contact plugs of phosphorous-doped polycrystal silicon film.

FIG. 22 is a diagram illustrating a crystal structure model with vacancy-type defects. Vacancy=type defects are generated by changing the crystal structure of polycrystal silicon during a heat treatment. Silicon-interstitial in the source and drain diffusion layers are absorbed into the polycrystal silicon film that contacts with the source and drain diffusion layers, thereby generating vacancy-type defects in the source and drain diffusion layers. Namely, the vacancy-type defect concentration of the source and drain diffusion layers is increased by the heat treatment.

The present inventors also found out that the data retention time of the DRAM is likely to depend upon the concentration of vacancy-type defects in the vicinity of the p-n junction of the cell transistor. FIG. 23 is a diagram illustrating dependency of data retention time of DRAM upon the concentration of vacancy-type defects. As the concentration of vacancy-type defects is increased, the data retention time is decreased.

The presence of vacancy-type defects in a depletion layer can increase the leakage of p-n junction current. Increasing the leakage of p-n junction current shortens the data retention time of the DRAM. In other words, increasing the leakage of p-n junction current deteriorates data holding characteristics of the DRAM. The vacancy-type defect is formed by eliminating a silicon atom from a lattice of the crystal structure. Other silicon atoms adjacent to the empty lattice, from which silicon atom was eliminated, have tensile strains. Thus, the vacancy-type defects are likely to be stabled at a compressive strain field.

FIG. 24 is a diagram illustrating the dependency of data retention time upon compressive strain of a depletion layer of the DRAM cell transistor. Increasing the compressive strain of the depletion layer shortens the data retention time. This demonstrates that increasing the compressive strain of the depletion layer increases the concentration of vacancy-type defects as generated. The cell transistors of the DRAM have polysilicon plugs. Thus, increasing the concentration of vacancy-type defects increases the leakage of junction current and deteriorates the information holding characteristics.

It is necessary to suppress the absorption of silicon-interstitial into the polycrystal silicon in the contact plug while a heat treatment is carried out at high temperature after the contact plug of polycrystal silicon film has been formed in the contact hole.

FIG. 25A is a photograph showing a cross section of a silicon substrate having an interface with a polysilicon film that extends over the silicon substrate. FIG. 25B is a photograph showing a cross section of a silicon substrate having an exposed surface, free of any polysilicon film. A single crystal silicon wafer free of any polysilicon film was prepared as a first sample. Another single crystal silicon wafer with an overlying polysilicon film was prepared as a second sample. After both the first and second samples were then subjected to a heat treatment at 1000° C. for 10 hours, the distribution of oxygen precipitate in the silicon substrate was observed by a known observation method using a defect etchant. The first and second samples of wafer were subjected to a heat treatment and the wafers were cleaved. The cleaved facets of the wafers were then exposed to a detect etchant such as a fluoronitric acid solution, thereby wet-etching the cleaved facets of the wafers. The cleaved facets of the wafers were then observed by an optical microscope.

As shown in FIG. 25A, oxygen precipitate was observed in the silicon substrate of the first ample in the vicinity of the interface between the silicon substrate and the polycrystal silicon film. As shown in FIG. 25B, almost no oxygen precipitate was observed in the silicon substrate of the second sample.

FIG. 25C is a diagram illustrating the mechanism of generating vacancy-type defects in a single crystal structure of silicon by heat treatment. A single crystal silicon substrate 100 has a shallow trench isolation film 110 and an n-type diffusion layer 120. Agate insulating film is provided on the surface of the silicon substrate 100. Agate electrode 130 is formed on the gate insulating film. A polysilicon contact plug 140 is provided which contacts with the silicon crystal silicon diffusion region 120. An inter-layer insulator 150 is provided which covers the shallow trench isolation film 110, the polysilicon contact plug 140, the gate electrode 130, and the gate insulating film. Grain boundary in the polycrystal silicon contact plug 140 has silicon deficiency which causes that silicon atoms are moved from the n-type diffusion layer 120 to the polycrystal silicon contact plug 140, thereby forming vacancy-type defects in the n-type diffusion layer 120.

In view of the above, it will be apparent to those skilled in the art from this disclosure that there exists a need for an improved semiconductor device and/or method of forming a semiconductor device. This invention addresses this need in the art as well as other needs, which will become apparent to those skilled in the art from this disclosure.

SUMMARY OF THE INVENTION

Accordingly, it is a primary object of the present invention to provide an improved semiconductor device.

It is another object of the present invention to provide a semiconductor device free from the above-described disadvantages.

It is a further object of the present invention to provide a semiconductor device that has a reduced leakage of junction current.

It is a still further object of the present invention to provide a semiconductor device that has a reduced leakage of junction current of DRAM cell transistor.

It is yet a further object of the present invention to provide a semiconductor device that has an improved information holding characteristic.

It is an additional object of the present invention to provide a semiconductor device that has reduced vacancy-type defects in a diffusion layer.

It is another object of the present invention to provide a semiconductor device that is formed by suppressing the absorption of silicon-interstitial of diffusion layer into a silicon plug during a heat treatment.

It is still another object of the present invention to provide a semiconductor device that is formed by suppressing formation of vacancy-type defects in a diffusion layer during a heat treatment.

It is yet another object of the present invention to provide a semiconductor device including a diffusion barrier layer which prevents that silicon-interstitial in a diffusion layer from being diffused into a silicon plug.

In accordance with a first aspect of the present invention, a semiconductor device may include, but is not limited to, a single crystal silicon diffusion layer, a polycrystal silicon conductor, and a diffusion barrier layer. The diffusion barrier layer separates the polycrystal silicon conductor from the single crystal silicon diffusion layer. The diffusion barrier layer prevents a diffusion of at least one of silicon-interstitial and silicon-vacancy between the single crystal silicon diffusion layer and the polycrystal silicon conductor.

In some cases, the polycrystal silicon conductor may have an impurity concentration in the range of $1E20 \text{ cm}^{-3}$ to $1E21 \text{ cm}^{-3}$. In this case, the diffusion barrier layer may include at least one of polycrystal and single crystal silicon films. The at least one of polycrystal and single crystal silicon films may contain at least one kind of element that is greater in covalent radius than silicon. The at least one kind of element may be selected from the group that includes germanium (Ge), arsenic (As), indium (In), tin (Sn), and antimony (Sb).

In some cases, the polycrystal silicon conductor may have an impurity concentration in the range of $1E20 \text{ cm}^{-3}$ to $1E21 \text{ cm}^{-3}$. The diffusion barrier layer may include at least one of polycrystal and single crystal silicon films. The at least one of polycrystal and single crystal silicon films may contain silicon-interstitial or nitrogen-interstitial.

In some cases, the diffusion barrier layer may include at least one of polycrystal and single crystal silicon films. The at least one of polycrystal and single crystal silicon films may contain silicon ions that are implanted at a dose in the range of $1E13 \text{ cm}^{-2}$ to $1E15 \text{ cm}^{-2}$.

In some cases, the polycrystal silicon conductor may be a polycrystal silicon contact plug that is provided in a contact hole which reaches at least a part of the single crystal silicon diffusion layer. The diffusion barrier layer may be provided at least on the bottom of the contact hole. The diffusion barrier layer may cover the side wall and bottom of the contact hole.

In some cases, the polycrystal silicon contact plug may contain phosphorus.

In some cases, the diffusion may be a thermal diffusion during a heat treatment.

In some cases, the single crystal silicon diffusion layer may be a source or drain diffusion layer of a MOS transistor. The semiconductor device may be a semiconductor memory device. The MOS transistor may be a memory cell transistor.

In accordance with a second aspect of the present invention, a method of forming a semiconductor device may include, but is not limited to the following processes. A single crystal silicon diffusion layer is formed in a semiconductor substrate. An insulating layer is formed over the semiconductor substrate. A contact hole is formed in the insulating layer. The contact hole reaches at least a part of the single crystal silicon diffusion layer. A diffusion barrier layer is formed in the contact hole. The diffusion barrier layer covers the at least part of the single crystal silicon diffusion layer. A polycrystal silicon contact plug is formed in the contact hole. The diffusion barrier layer separates the polycrystal silicon contact plug from the single crystal silicon diffusion layer. The diffusion barrier layer can prevent a diffusion of at least one of silicon-interstitial and silicon-vacancies between the single crystal silicon diffusion layer and the polycrystal silicon contact plug.

In some cases, the polycrystal silicon contact plug may have an impurity concentration in the range of $1E20 \text{ cm}^{-3}$ to $1E21 \text{ cm}^{-3}$. The diffusion barrier layer may include at least one of polycrystal and single crystal silicon films. The at least one of polycrystal and single crystal silicon films may contain at least one kind of element that is greater in covalent radius than silicon.

In some cases, the at least one kind of element may be selected from the group including germanium (Ge), arsenic (As), indium (In), tin (Sn), and antimony (Sb).

In some cases, the polycrystal silicon contact plug may have an impurity concentration in the range of $1E20 \text{ cm}^{-3}$ to $1E21 \text{ cm}^{-3}$. The diffusion barrier layer may include at least one of polycrystal and single crystal silicon films. The at least one of polycrystal and single crystal silicon films may contain silicon-interstitial or nitrogen-interstitial.

In some cases, the diffusion barrier layer may include at least one of polycrystal and single crystal silicon films. The at least one of polycrystal and single crystal silicon films may contain silicon ions that are implanted at a dose in the range of $1E13 \text{ cm}^{-2}$ to $1E15 \text{ cm}^{-2}$.

In some cases, the diffusion barrier layer may be formed at least on the bottom of the contact hole. The diffusion barrier layer may cover the side wall and bottom of the contact hole.

In some cases, the polycrystal silicon contact plug may contain phosphorus.

In some cases, the method may further include the process. A heat treatment is carried out to activate phosphorus in the polycrystal silicon contact plug, while the diffusion barrier layer preventing a thermal diffusion of the at least one of silicon-interstitial and silicon-vacancy between the single crystal silicon diffusion layer and the polycrystal silicon contact plug.

In some cases, the diffusion barrier layer may be a silicon film that contains at least one kind of element that is greater in covalent radius than silicon. In other cases, the diffusion barrier layer may be a silicon film that contains an excess amount of silicon. Once silicon atom at a lattice is replaced by the element greater in covalent radius than silicon, the element provides compressive strain to silicon lattices adjacent to the replaced element. Silicon vacancy provides tensile strain to silicon lattices adjacent to the silicon-vacancy. The polycrystal silicon film containing element as impurity, which is greater in covalent radius than silicon, is likely to capture silicon-vacancies while releasing silicon-interstitial, thereby obtaining the stability in energy.

The polycrystal silicon film containing an excess amount of silicon is likely to capture silicon-vacancies while releasing silicon-interstitial, thereby obtaining the stability in energy.

At least one of the polycrystal silicon film containing element as impurity, which is greater in covalent radius than silicon, and the polycrystal silicon film containing an excess amount of silicon, can be used as a diffusion barrier layer that separates the polycrystal silicon conductor or contact plug from the single crystal silicon diffusion layer. The diffusion barrier layer releases silicon-interstitial. In other words, the diffusion barrier layer prevents that silicon-interstitial is supplied from the single crystal diffusion layer to the polycrystal silicon conductor or contact plug.

A polycrystal silicon film is formed to form a contact plug of polycrystal silicon. During a heat treatment, the diffusion barrier layer releases silicon-interstitial and absorbs silicon-vacancies, thereby preventing that the contact plug of polycrystal silicon from absorbing silicon-interstitial from the single crystal diffusion layer. As a result, the diffusion layer can prevent formation of vacancy-type defects in the single crystal diffusion layer.

The diffusion barrier layer can prevent that silicon-interstitial is diffused from the single crystal diffusion layer to the contact plug of polycrystal silicon, and prevent that the single crystal diffusion layer absorbs silicon-vacancies, thereby preventing formation of vacancy-type defects in the single crystal diffusion layer. This can reduce leakage of p-n junction current. If the semiconductor device is applied to the memory device such as DRAM, the diffusion barrier layer can improve information hold characteristic of the memory device.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 1:
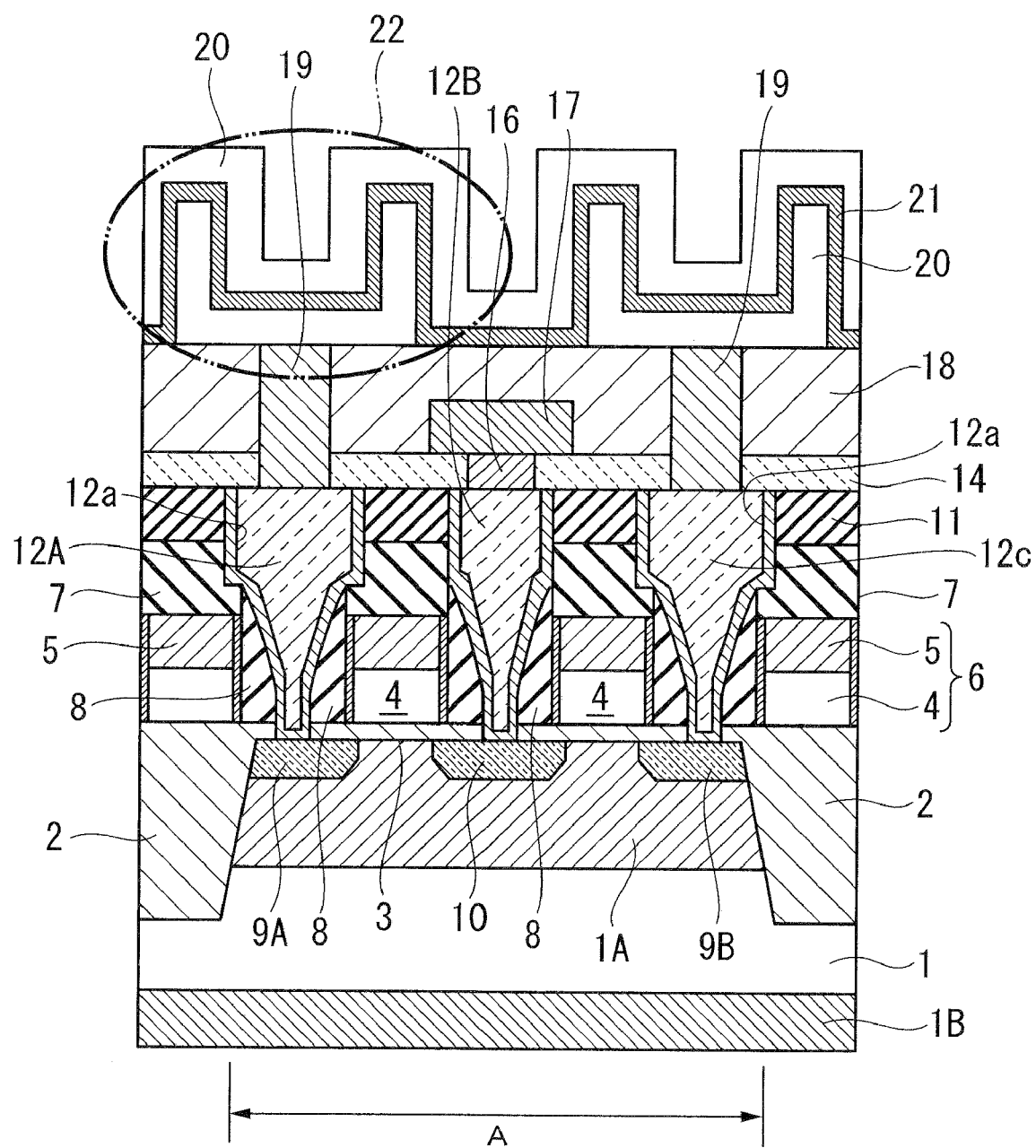
FIG. 1 is a fragmentary cross sectional elevation view illustrating a semiconductor device in accordance with a first embodiment of the present invention.

FIG. 1 is a fragmentary cross sectional elevation view illustrating a semiconductor device in accordance with a first embodiment of the present invention. A semiconductor device is formed on a semiconductor substrate 1. In some cases, the semiconductor substrate 1 may be made of a semiconductor that contains impurity at a predetermined impurity concentration. Typically, the semiconductor substrate 1 may be made of silicon. A device isolation region 2 is selectively formed on the semiconductor substrate 1. The device isolation region 2 defines an active region A of the semiconductor substrate 1. The device isolation region 2 can be formed by a shallow trench isolation method. The device isolation region 2 isolates a selecting transistor or transistors which are formed in the active region A. The active region A is a region for forming a transistor or transistors. The active region A is defined by the device isolation region 2. A doped layer 1A is formed in a shallow region of the active region A.

A source diffusion layer 9A, a drain diffusion layer 10, and a source diffusion layer 9B are selectively formed in the doped layer 1A. The drain diffusion layer 10 is interposed between the source diffusion layers 9A and 9B. The drain diffusion layer 10 is distanced from the source diffusion layers 9A and 9B. Each of the source diffusion layers 9A and 9B and the drain diffusion layer 10 is isolated by the doped layer 1A. The source diffusion layers 9A and 9B and the drain diffusion layer 10 have surfaces that are level to the top surface of the doped layer 1A. The source diffusion layers 9A and 9B and the drain diffusion layer 10 have surfaces that are level to the top surface of the doped layer 1A.

A gate insulating film 3 is provided, which extends over the source diffusion layers 9A and 9B and the drain diffusion layer 10 as well as the doped layer 1A. In other words, the gate insulating film 3 covers the source diffusion layers 9A and 9B and the drain diffusion layer 10 as well as the doped layer 1A. The gate insulating film 3 can be a silicon oxide film that is formed by a thermal oxidation of silicon.

A buried well layer 1B is formed in the semiconductor substrate 1. The buried well layer 1B is deeper than the doped layer 1A. The buried well layer 1B is distanced from the doped layer 1A in depth direction. The buried well layer 1 is deeper than the device isolation region 2.

Gate electrodes 6 are selectively formed over the gate insulating film 3 and the device isolation region 2. The gate electrodes 6 are not positioned over the source diffusion layers 9A and 9B and the drain diffusion layer 10. Each of the gate electrodes 6 has a multi-layered structure of a polycrystal silicon film 4 and a metal film 5. The polycrystal silicon film 4 is provided on the gate insulating film 3. The metal film 5 is provided on the polycrystal silicon film 4. The polycrystal silicon film 4 may be an impurity-doped polycrystal silicon film 4 which can be formed by a chemical vapor deposition method. The metal film 5 may be a refractory metal such as tungsten (W) or tungsten silicide (WSi).

An insulating film 7 is provided, which extends over the metal film 5. The insulating film 7 may be a silicon nitride film. A first inter-layer insulator 11 is provided, which extends over the insulating film 7. The first inter-layer insulator 11 may be a silicon oxide film. Side walls 8 are formed on side walls of the gate electrodes 6. The side walls 8 may be made of an insulator such as silicon nitride.

Contact plugs 12A, 12B, and 12C are provided over the source diffusion layer 9A, the drain diffusion layer 10, and the source diffusion layer 9B, respectively. Each of the contact plugs 12A, 12B, and 12C is provided between the two adjacent gate electrodes 6. Each of the contact plugs 12A, 12B, and 12C is interposed between the side walls 8 that are provided on the side walls of the gate electrodes 6. Each of the contact plugs 12A, 12B, and 12C has a diffusion barrier layer 12a. The diffusion barrier layer 12a covers the bottom and side surface of each of the contact plugs 12A, 12B, and 12C. The diffusion barrier layer 12a has an electrical conductivity. The contact plug 12A with the diffusion barrier layer 12a contacts with the source diffusion layer 9A. The contact plug 12B with the diffusion barrier layer 12a contacts with the drain diffusion layer 10. The contact plug 12C with the diffusion barrier layer 12a contacts with the source diffusion layer 9B. Each of the contact plugs 12A, 12B, and 12C contains phosphorous.

The contact plugs 12A, 12B, and 12C may be formed in contact holes. The contact holes are formed in the gate insulating film 3, the insulating film 7, the first inter-layer insulator 11 and the side wall insulating film 8. Each of the contact plugs 12A, 12B, and 12C includes a lower portion and an upper portion. The lower portion is narrower than the upper portion. The side wall 8 is positioned between the gate electrode 6 and the lower portion of the contact plug 12A, 12B, or 12C. The upper portions of the contact plugs 12A, 12B, and 12C have the same level as the insulating film 7 and the first inter-layer insulator 11. The diffusion barrier layer 12a separates the lower portion of each of the contact plugs 12A, 12B, and 12C from the side walls 8. The diffusion barrier layer 12a also separates the upper portion of each of the contact plugs 12A, 12B, and 12C from the insulating film 7 and the first inter-layer insulator 11. The diffusion barrier layer 12a also separates the bottom of the contact plugs 12A, 12B, or 12C from the source diffusion layer 9A, the drain diffusion layer 10, or the source diffusion layer 9B, respectively.

The diffusion barrier layer 12a that separates the contact plug 12A from the source diffusion layer 9A can prevent that silicon-interstitial in the source diffusion layer 9A is diffused into the contact plug 12A. The diffusion barrier layer 12a that separates the contact plug 12A from the source diffusion layer 9A can also prevent diffusion of vacancy-type defects into the source diffusion layer 9A.

The diffusion barrier layer 12a that separates the contact plug 12B from the drain diffusion layer 10 can prevent that silicon-interstitial in the drain diffusion layer 9B is diffused into the contact plug 12B. The diffusion barrier layer 12a that separates the contact plug 12B from the drain diffusion layer 10 can also prevent diffusion of vacancy-type defects into the drain diffusion layer 10.

The diffusion barrier layer 12a that separates the contact plug 12C from the source diffusion layer 9B can prevent that silicon-interstitial in the source diffusion layer 9B is diffused into the contact plug 12C. The diffusion barrier layer 12a that separates the contact plug 12C from the source diffusion layer 9B can also prevent diffusion of vacancy-type defects into the source diffusion layer 9B.

The diffusion barrier layer 12a has a function to prevent diffusions of silicon-interstitial and vacancy-type defects between single crystal silicon layer and polycrystal silicon.

In some cases, it is possible, but should not be limited, that when the contact plugs 12A, 12B and 12C have a dopant concentration in the range of $1E20$ $cm^{-3}$ to $1E21$ $cm^{-3}$, the diffusion barrier layer 12a may be made of polycrystal silicon containing at least an element that is larger in covalent radius than silicon. Typical examples of the elements that are larger in covalent radius than silicon are germanium (Ge), arsenic (As), indium (In), tin (Sn), and antimony (Sb). One or more elements larger in covalent radius than silicon may be contained in polycrystal silicon of the diffusion barrier layer 12a. It can be possible to select one or more elements in view of improving the performance of the transistor.

In other cases, it is also possible, but should not be limited, that when the contact plugs 12A, 12B and 12C have a dopant concentration in the range of $1E20$ $cm^{-3}$ to $1E21$ $cm^{-3}$, the diffusion barrier layer 12a may be made of polycrystal silicon containing silicon-interstitial or nitrogen-interstitial, or single crystal silicon containing silicon-interstitial or nitrogen-interstitial.

In other cases, it is also possible, but should not be limited, that when the contact plugs 12A, 12B and 12C have a dopant concentration in the range of $1E20$ $cm^{-3}$ to $1E21$ $cm^{-3}$, the diffusion barrier layer 12a may be made of polycrystal silicon containing silicon ions that are implanted at a dose in the range of $1E13$ $cm^{-2}$ to $1E15$ $cm^{-2}$, instead of the above-mentioned elements. The upper limit of the concentration of silicon ions of the diffusion barrier layer 12a can be determined to prevent that an excess amount of silicon-interstitial as released forms crystal defects in each of the source diffusion layers 9A and 9B and the drain diffusion layer 10. The lower limit of the concentration of silicon ions of the diffusion barrier layer 12a can be determined to ensure a certain improvement in the data retention time or refresh time of the semiconductor memory device such as the DRAM if the semiconductor device is applied to the semiconductor memory device such as the DRAM.

As described above, each of the contact plugs 12A, 12B and 12C has the upper and lower portions. The upper portion is wider than the lower portion. In some cases, the side wall of the upper portion of each of the contact plugs 12A, 12B and 12C can, in plan view, be aligned to the side wall of the gate electrode 6. In other cases, the upper portion of each of the contact plugs 12A, 12B and 12C can, in plan view, overlap partially the gate electrode 6. The horizontal sectioned area of the upper portion of each of the contact plugs 12A, 12B and 12C can be greater than the horizontal sectioned area of the lower portion thereof. The top surface of the upper portion of each of the contact plugs 12A, 12B and 12C can be greater in area than the bottom surface of the lower portion thereof.

A groove is formed between the contact plugs 12A, 12B and 12C. The insulating film 11 is formed in the groove. The contact plugs 12A, 12B and 12C are isolated from each other by the insulating film 11. The top surfaces of the contact plugs 12A, 12B and 12C are leveled to the top surface of the first inter-layer insulator 11. A second inter-layer insulator 14 is provided, which extends over the top surfaces of the contact plugs 12A, 12B and 12C and the first inter-layer insulator 11.

A contact hole is formed in the second inter-layer insulator 14. The contact hole is positioned over the contact plug 12B, so that a part of the top surface of the contact plug 12B is shown through the contact hole. A contact plug 16 is formed within the contact hole of the second inter-layer insulator 14. The contact plug 16 contacts with the top surface of the contact plug 12B. The contact plug 16 is electrically connected through the contact plug 12B and the diffusion barrier layer 12a to the drain diffusion layer 10. The contact plug 16 may be made of a conductive material such as a metal. The contact plug 16 may be realized by a multi-layered structure of a titanium film, a titanium nitride film, and a tungsten film.

A bit line 17 is provided, which extends over the second inter-layer insulator 14. The bit line 17 contacts with the contact plug 16. The bit line 17 is electrically connected through the contact plug 16, the contact plug 12B and the diffusion barrier layer 12a to the drain diffusion layer 10.

A third inter-layer insulator 18 is provided over the bit line 17 and the second inter-layer insulator 14. Namely, the third inter-layer insulator 18 covers the bit line 17 and the second inter-layer insulator 14.

Contact holes are formed in the second and third inter-layer insulators 14 and 18. The contact holes are positioned over the contact plugs 12A and 12C, so that parts of the top surfaces of the contact plugs 12A and 12C are shown through the contact holes. Contact plugs 19 are formed within the contact holes of the second and third inter-layer insulators 14 and 18. The contact plugs 16 contacts with the top surfaces of the contact plugs 12A and 12C. The contact plugs 19 are electrically connected through the contact plugs 12A and 12C and the diffusion barrier layers 12a to the source diffusion layers 9A and 9B. In some cases, the contact plug 19 may be made of polycrystal silicon. In other cases, the contact plug 19 may be made of a metal. The contact plug 19 may be realized by a multi-layered structure of a titanium film, a titanium nitride film, and a tungsten film.

A fourth inter-layer insulator 20 is provided which extends over the contact plugs 19 and the third inter-layer insulator 18. A lamination structure 21 is provided in the fourth inter-layer insulator 20. The lamination structure 21 includes a bottom electrode film, a capacitive insulating film, and a top electrode film. The capacitive insulating film is sandwiched between the bottom and top electrode films. The lamination structure 21 provides capacitive structures 22, each of which includes the top and bottom electrode films and the capacitive insulating film. The capacitive structures 22 are electrically connected through the contact plugs 19, the contact plugs 12A and 12C, and the diffusion barrier layers 12a to the source diffusion layers 9A and 9B.

After the contact plugs 12A, 12B and 12C are formed, a heat treatment is carried out to activate phosphorous in the contact plugs 12A, 12B and 12C. The heat treatment can be carried out at a temperature in the range of 950° C. to 1050° C. for ten seconds to a few minutes. The diffusion barrier layer 12a that separates the contact plug 12A from the source diffusion layer 9A can prevent that silicon-interstitial in the source diffusion layer 9A is diffused into the contact plug 12A during the heat treatment for activation of a dopant in the contact plug 12A. The diffusion barrier layer 12a that separates the contact plug 12A from the source diffusion layer 9A can also prevent diffusion of vacancy-type defects into the source diffusion layer 9A during the heat treatment for activation of a dopant in the contact plug 12A.

The diffusion barrier layer 12a that separates the contact plug 12B from the drain diffusion layer 10 can prevent that silicon-interstitial in the drain diffusion layer 9B is diffused into the contact plug 12B during the heat treatment for activation of a dopant in the contact plug 12B. The diffusion barrier layer 12a that separates the contact plug 12B from the drain diffusion layer 10 can also prevent diffusion of vacancy-type defects into the drain diffusion layer 10 during the heat treatment for activation of a dopant in the contact plug 12B.

The diffusion barrier layer 12a that separates the contact plug 12C from the source diffusion layer 9B can prevent that silicon-interstitial in the source diffusion layer 9B is diffused into the contact plug 12C during the heat treatment for activation of a dopant in the contact plug 12C. The diffusion barrier layer 12a that separates the contact plug 12C from the source diffusion layer 9B can also prevent diffusion of vacancy-type defects into the source diffusion layer 9B during the heat treatment for activation of a dopant in the contact plug 12C.

The diffusion barrier layer 12a can prevent diffusion of silicon atoms and silicon-vacancies between the polycrystal silicon contact plugs 12A, 12B, and 12C and the single crystal silicon source and drain diffusion layers 9A, 9B and 10. Preventing diffusion of silicon atoms and silicon-vacancies can prevent leakage of p-n junction current. Thus, the diffusion barrier layer 12a can prevent or reduce leakage of p-n junction current. Preventing diffusion of silicon atoms and silicon-vacancies can further prevent deterioration of data holding characteristics. Thus, the diffusion barrier layer 12a can prevent deterioration of data holding characteristics.

The above-described semiconductor device can be applied to a DRAM.

Figure 2:
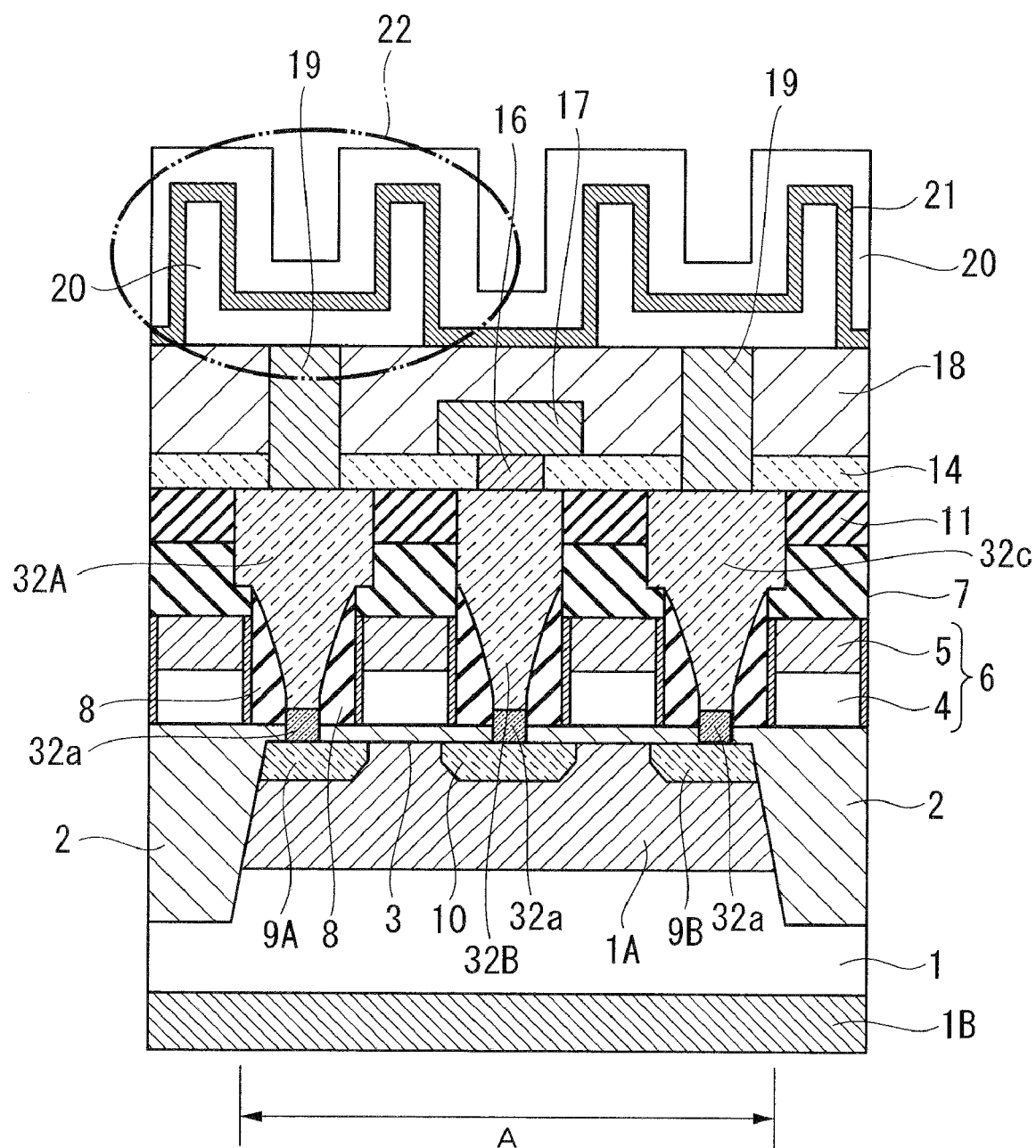
FIG. 2 is a fragmentary cross sectional elevation view illustrating a semiconductor device in accordance with a second embodiment of the present invention.

FIG. 2 is a fragmentary cross sectional elevation view illustrating a semiconductor device in accordance with a second embodiment of the present invention. The structural difference between the semiconductor devices of the first and second embodiments is the structure of the contact plug which contacts with the diffusion layer in the semiconductor substrate. The following descriptions will focus on the structural difference between the semiconductor devices of the first and second embodiments, while duplicate descriptions will be omitted.

In accordance with the first embodiment, the semiconductor device of FIG. 1 has the contact plugs 12A, 12B and 12C with the diffusion barrier layers 12a. The diffusion barrier layer 12a covers the bottom and the side wall of each of the contact plugs 12A, 12B and 12C. The diffusion barrier layer 12a separates the contact plug 12A from the source diffusion layer 9A. The diffusion barrier layer 12a separates the contact plug 12B from the drain diffusion layer 10. The diffusion barrier layer 12a separates the contact plug 12C from the source diffusion layer 9B.

In accordance with the second embodiment, the semiconductor device of FIG. 2 has contact plugs 32A, 32B and 3C with diffusion barrier layers 32a. The diffusion barrier layer 12a covers only the bottom of each of the contact plugs 32A, 32B and 3C. The diffusion barrier layer 32a does not cover the side wall of each of the contact plugs 32A, 32B and 3C. Contact holes are formed in the gate insulating film 3, the side wall insulating film 8, the insulating film 7 and the first inter-layer insulator 11. Parts of the source and drain diffusion layers 9A, 9B and 10 are shown through the contact holes. The diffusion barrier layers 32a are provided at the bottoms of the contact holes. The diffusion barrier layers 32a contact with the source and drain diffusion layers 9A, 9B and 10. The diffusion barrier layers 32a fill the bottom portions of the contact holes. The contact plugs 32A, 32B and 3C are provided on the diffusion barrier layers 32a. The contact plugs 32A, 32B and 3C with the diffusion barrier layers 32a fill up the contact holes. The contact plugs 32A, 32B and 3C have side walls that contact with the side wall insulating film 8, the first insulating film 7, and the first inter-layer insulator 11.

The contact plug 32A is provided over the source diffusion layer 9A. The contact plug 32A is electrically connected through the diffusion barrier layer 32a to the source diffusion layer 9A. The contact plug 32A is separated by the diffusion barrier layer 32a from the source diffusion layer 9A. Namely, the diffusion barrier layer 32a separates the contact plug 32A from the source diffusion layer 9A. The diffusion barrier layer 32a can prevent that silicon-interstitial in the source diffusion layer 9A is diffused into the contact plug 32A during the heat treatment for activation of a dopant in the contact plug 32A. The diffusion barrier layer 32a can also prevent diffusion of vacancy-type defects into the source diffusion layer 9A during the heat treatment for activation of a dopant in the contact plug 32A. The diffusion barrier layer 32a is greater in thickness than the gate insulating film 3. The top of the diffusion barrier layer 32a is positioned above the top of the gate insulating film 3. In other words, the diffusion barrier layer 32a has a lower portion that is leveled to the gate insulating film 3 and an upper portion that is surrounded by the side wall insulating film 8.

The contact plug 32B is provided over the drain diffusion layer 10. The contact plug 32B is electrically connected through the diffusion barrier layer 32a to the drain diffusion layer 10. The contact plug 32B is separated by the diffusion barrier layer 32a from the drain diffusion layer 10. Namely, the diffusion barrier layer 32a separates the contact plug 32B from the drain diffusion layer 10. The diffusion barrier layer 32a can prevent that silicon-interstitial in the drain diffusion layer 10 is diffused into the contact plug 32B during the heat treatment for activation of a dopant in the contact plug 32B. The diffusion barrier layer 32a can also prevent diffusion of vacancy-type defects into the drain diffusion layer 10 during the heat treatment for activation of a dopant in the contact plug 32B. The diffusion barrier layer 32a is greater in thickness than the gate insulating film 3. The top of the diffusion barrier layer 32a is positioned above the top of the gate insulating film 3. In other words, the diffusion barrier layer 32a has a lower portion that is leveled to the gate insulating film 3 and an upper portion that is surrounded by the side wall insulating film 8.

The contact plug 32C is provided over the source diffusion layer 9B. The contact plug 32C is electrically connected through the diffusion barrier layer 32a to the source diffusion layer 9B. The contact plug 32C is separated by the diffusion barrier layer 32a from the source diffusion layer 9B. Namely, the diffusion barrier layer 32a separates the contact plug 32C from the source diffusion layer 9B. The diffusion barrier layer 32a can prevent that silicon-interstitial in the source diffusion layer 9B is diffused into the contact plug 32C during the heat treatment for activation of a dopant in the contact plug 32C. The diffusion barrier layer 32a can also prevent diffusion of vacancy-type defects into the source diffusion layer 9B during the heat treatment for activation of a dopant in the contact plug 32C. The diffusion barrier layer 32a is greater in thickness than the gate insulating film 3. The top of the diffusion barrier layer 32a is positioned above the top of the gate insulating film 3. In other words, the diffusion barrier layer 32a has a lower portion that is leveled to the gate insulating film 3 and an upper portion that is surrounded by the side wall insulating film 8.

The diffusion barrier layer 32a has a function to prevent diffusions of silicon-interstitial and vacancy-type defects between single crystal silicon layer and polycrystal silicon.

In some cases, it is possible, but should not be limited, that when the contact plugs 32A, 32B and 32C have a dopant concentration in the range of $1E20$ cm$^{-3}$ to $1E21$ cm$^{-3}$, the diffusion barrier layer 32a may be made of polycrystal silicon containing at least an element that is larger in covalent radius than silicon. Typical examples of the elements that are larger in covalent radius than silicon are germanium (Ge), arsenic (As), Indium (In), tin (Sn), and antimony (Sb). One or more elements larger in covalent radius than silicon may be contained in polycrystal silicon of the diffusion barrier layer 32a. It can be possible to select one or more elements in view of improving the performance of the transistor.

In other cases, it is also possible, but should not be limited, that when the contact plugs 32A, 32B and 32C have a dopant concentration in the range of $1E20 \ cm^{-3}$ to $1E21 \ cm^{-3}$, the diffusion barrier layer 32a may be made of polycrystal silicon containing silicon-interstitial or nitrogen-interstitial, or single crystal silicon containing silicon-interstitial or nitrogen-interstitial.

In other cases, it is also possible, but should not be limited, that when the contact plugs 32A, 32B and 32C have a dopant concentration in the range of $1E20 \ cm^{-3}$ to $1E21 \ cm^{-3}$, the diffusion barrier layer 32a may be made of polycrystal silicon containing silicon ions at a concentration in the range of $1E13 \ cm^{-3}$ to $1E15 \ cm^{-3}$, instead of the above-mentioned elements. The upper limit of the concentration of silicon ions of the diffusion barrier layer 32a can be determined to prevent that an excess amount of silicon-interstitial as released forms crystal defects in each of the source diffusion layers 9A and 9B and the drain diffusion layer 10. The lower limit of the concentration of silicon ions of the diffusion barrier layer 32a can be determined to ensure a certain improvement in the data retention time or refresh time of the semiconductor memory device such as the DRAM if the semiconductor device is applied to the semiconductor memory device such as the DRAM.

The diffusion barrier layer 32a can prevent diffusion of silicon atoms and silicon-vacancies between the polycrystal silicon contact plugs 32A, 32B, and 32C and the single crystal silicon source and drain diffusion layers 9A, 9B and 10. Preventing diffusion of silicon atoms and silicon-vacancies can prevent leakage of p-n junction current. Thus, the diffusion barrier layer 32a can prevent or reduce leakage of p-n junction current. Preventing diffusion of silicon atoms and silicon-vacancies can further prevent deterioration of data holding characteristics. Thus, the diffusion barrier layer 32a can prevent deterioration of data holding characteristics.

FIGS. 3 through 11 are fragmentary cross sectional elevation views illustrating semiconductor devices of in sequential steps involved in a method of forming the semiconductor device of FIG. 1 in accordance with the first embodiment of the present invention.

Figure 3:
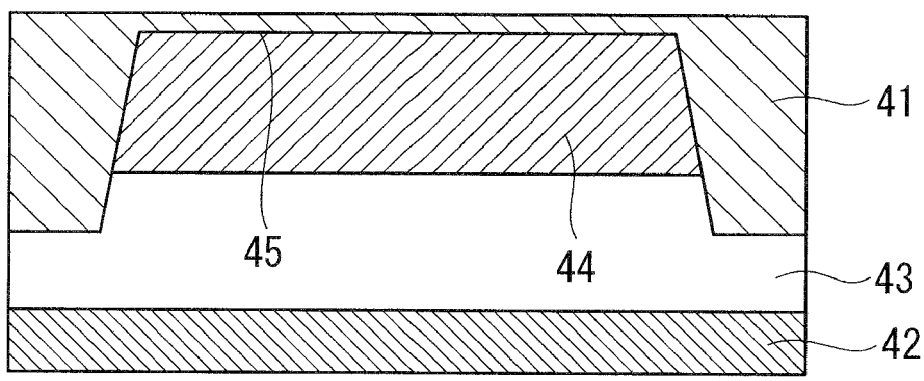
FIG. 3 is a fragmentary cross sectional elevation view illustrating a semiconductor device of in a step involved in a method of forming the semiconductor device of FIG. 1 in accordance with the first embodiment of the present invention.

As shown in FIG. 3, a silicon substrate is prepared. Trench isolation regions 41 are selectively formed on a main surface of the silicon substrate. The trench isolation regions 41 define an active region of the semiconductor substrate. An ion-implantation process is carried out to introduce phosphorus into the silicon substrate, thereby forming an n-type buried well layer 42 in the silicon substrate. The n-type buried well layer 42 extends under the active region and the trench isolation regions 41. The ion-implantation process can be carried out at ion-implantation energy of 1000 keV and a dose of $1E13 \ cm^{-2}$. After the ion-implantation process is carried out, a heat treatment is carried out in a nitrogen atmosphere at 1000° C. for 10 seconds. A silicon oxide film 45 having a thickness of 10 nanometers is formed on the surface of the silicon substrate.

An ion-implantation process is carried out to introduce boron into the silicon substrate through the silicon oxide film 45, thereby forming a p-type well layer 43 in the silicon substrate. The p-type well layer 43 extends over the n-type buried well layer 42 and under the active region and the trench isolation regions 41. The ion-implantation process can be carried out by a set of four ion-implantation processes. The first ion-implantation process for introducing boron is carried out at ion-implantation energy of 300 keV and a dose of $1E13 \ cm^{-2}$. After the first ion-implantation process is carried out, a first heat treatment is carried out in a nitrogen atmosphere at 1000° C. for 10 seconds. The second ion-implantation process for introducing boron is carried out at ion-implantation energy of 150 keV and a dose of $5E12 \ cm^{-2}$. Then, the third ion-implantation process for introducing boron is carried out at ion-implantation energy of 50 keV and a dose of $1E12 \ cm^{-2}$. Then, the fourth ion-implantation process for introducing boron is carried out at ion-implantation energy of 10 keV and a dose of $2E12 \ cm^{-2}$. After the fourth ion-implantation process is carried out, a second heat treatment is carried out at 1000° C. for 30 seconds.

An ion-implantation process is carried out to introduce boron into the silicon substrate, thereby forming a p-type channel doped layer 44 in the silicon substrate. The p-type channel doped layer 44 extends over the p-type well layer 43. The p-type channel doped layer 44 extends within the active region defined by the trench isolation regions 41. The ion-implantation process can be carried out at ion-implantation energy of 9 keV and a dose of $7E12 \ cm^{-2}$. After the ion-implantation process is carried out, a heat treatment is carried out at 1000° C. for 10 seconds.

Figure 4:
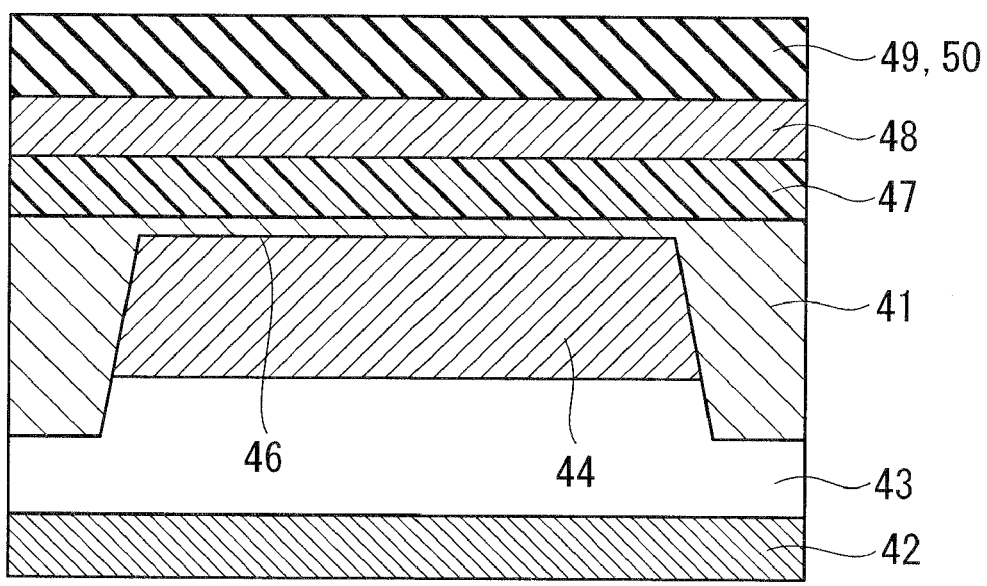
FIG. 4 is a fragmentary cross sectional elevation view illustrating a semiconductor device of in a subsequent step involved in the method of forming the semiconductor device of FIG. 1 in accordance with the first embodiment of the present invention.

As shown in FIG. 4, the silicon oxide film 45 having a thickness of 10 nanometers is removed from the surface of the silicon substrate to expose the top surface of the p-type channel doped layer 44. A gate oxide film 46 is formed on the top surface of the p-type channel doped layer 44 by a thermal oxidation of silicon. The gate oxide film 46 has a thickness of 7 nanometers. A highly phosphorus doped polycrystal silicon film 47 is formed over the gate oxide film 46 and the trench isolation regions 41. The highly phosphorus doped polycrystal silicon film 47 has a thickness of 70 nanometers. A tungsten silicide film 48 is formed over the highly phosphorus doped polycrystal silicon film 47. The tungsten silicide film 48 has a thickness of 100 nanometers. A silicon nitride film 49 is formed over the tungsten silicide film 48. The silicon nitride film 49 has a thickness of 150 nanometers. A silicon oxide film 50 is formed over the silicon nitride film 49. The silicon oxide film 50 has a thickness of 30 nanometers.

Figure 5:
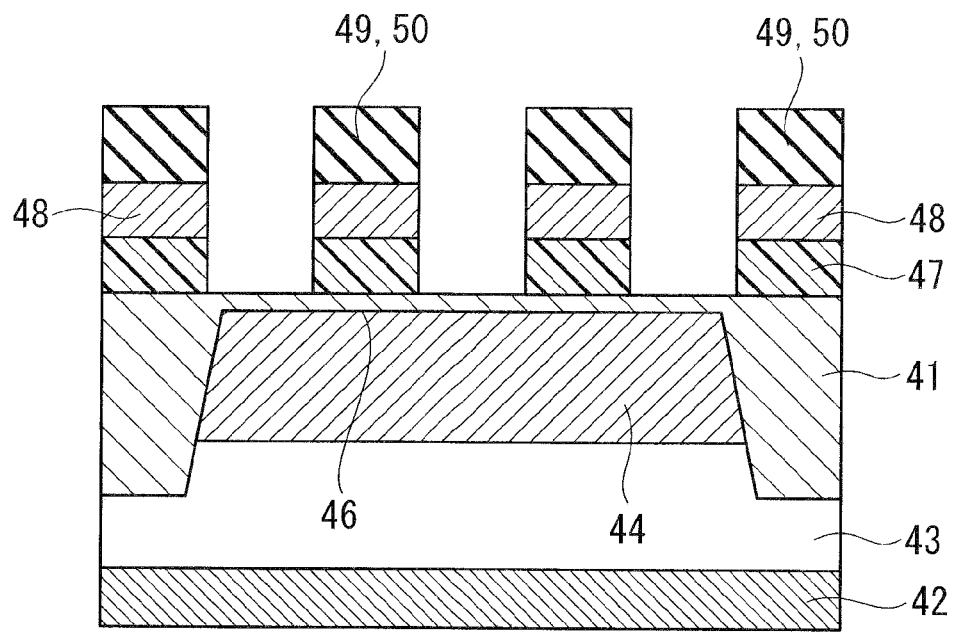
FIG. 5 is a fragmentary cross sectional elevation view illustrating a semiconductor device of in a subsequent step involved in the method of forming the semiconductor device of FIG. 1 in accordance with the first embodiment of the present invention.

As shown in FIG. 5, the silicon oxide film 50, the silicon nitride film 49, the tungsten silicide film 48, and the highly phosphorus doped polycrystal silicon film 47 are selectively and sequentially removed, thereby leaving stacked structures over the silicon substrate. In other words, the laminations of the silicon oxide film 50, the silicon nitride film 49, the tungsten silicide film 48, and the highly phosphorus doped polycrystal silicon film 47 are patterned to form the stacked structures. Each stacked structure has the highly phosphorus doped polycrystal silicon film 47, the tungsten silicide film 48, and the silicon oxide film 50.

Figure 6:
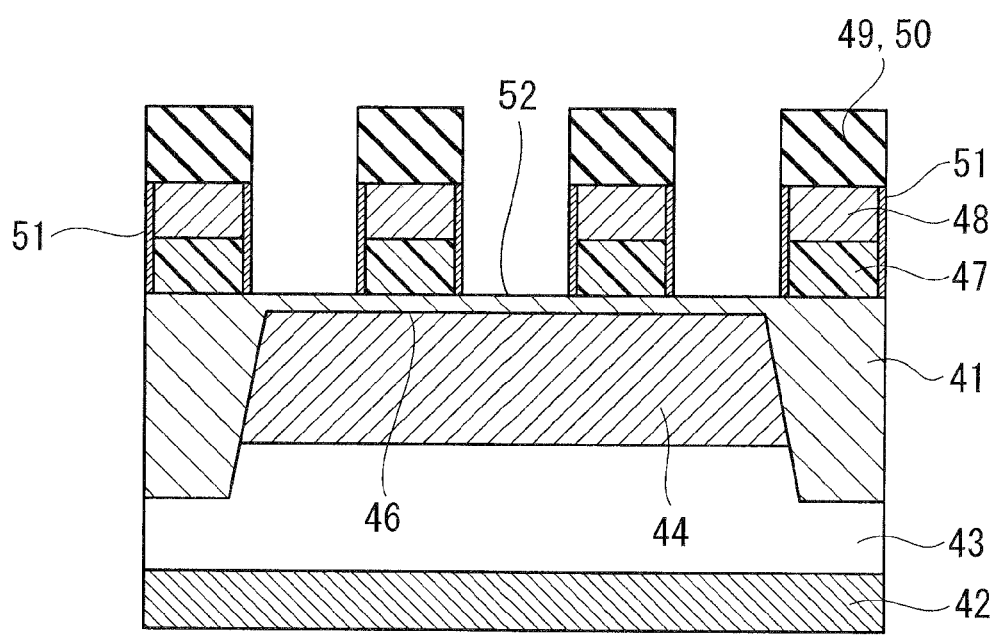
FIG. 6 is a fragmentary cross sectional elevation view illustrating a semiconductor device of in a subsequent step involved in the method of forming the semiconductor device of FIG. 1 in accordance with the first embodiment of the present invention.

As shown in FIG. 6, a thermal oxidation process is carried out to form silicon oxide films 51 on side walls of the highly phosphorus doped polycrystal silicon film 47 and the tungsten silicide film 48. The conditions for carrying out the thermal oxidation is such that the silicon oxide film 51 on the side wall of the highly phosphorus doped polycrystal silicon film 47 has a thickness of 10 nanometers. The thermal oxidation process forms not only the silicon oxide films 51 but also a silicon oxide film 52 over the silicon substrate. The silicon oxide film 52 has a thickness of 8 nanometers.

Figure 7:
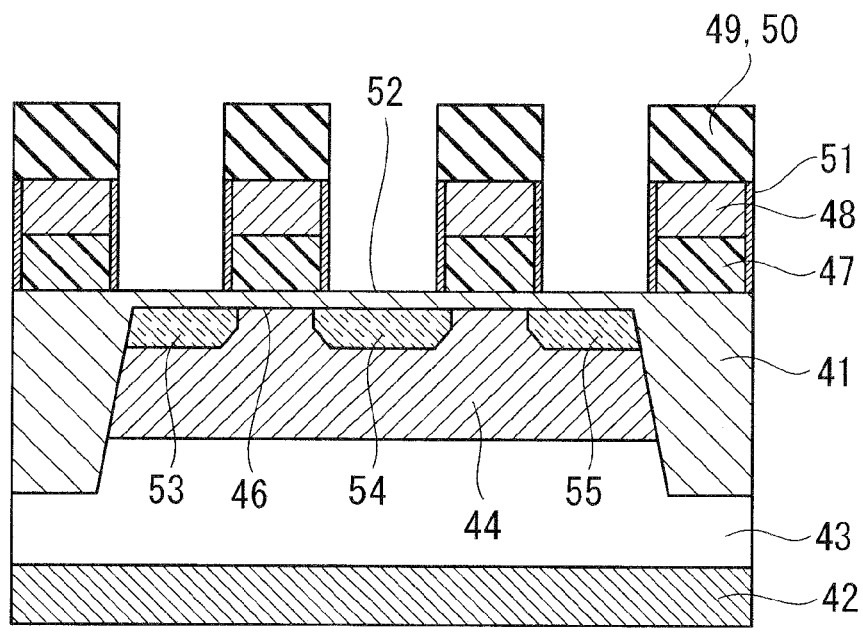
FIG. 7 is a fragmentary cross sectional elevation view illustrating a semiconductor device of in a subsequent step involved in the method of forming the semiconductor device of FIG. 1 in accordance with the first embodiment of the present invention.

As shown in FIG. 7, an ion-implantation process is carried out to introduce phosphorous selectively into the p-type channel doped layer 44, by using the stack structures as masks, thereby forming n-type lightly doped diffusion layers 53, 54, and 55 in the shallow region of the p-type channel doped layer 44. The n-type lightly doped diffusion layers 53, 54, and 55 do not extend under the stacked structures that have the highly phosphorus doped polycrystal silicon film 47, the tungsten silicide film 48, and the silicon oxide film 50. The necessary dose of the ion-implantation process for introducing phosphorous is $1.8E13$ $cm^{-2}$. The ion-implantation process for introducing phosphorous can be carried out by a set of two ion-implantations. The first ion-implantation process for introducing phosphorous is carried out at ion-implantation energy of 15 keV and a dose of $9E12$ $cm^{-2}$. After the first ion-implantation process is carried out, a first heat treatment is carried out in a nitrogen atmosphere at 950° C. for 10 seconds. The second ion-implantation process for introducing phosphorous is carried out at ion-implantation energy of 10 keV and a dose of $9E12$ $cm^{-2}$. After the second ion-implantation process is carried out, a second heat treatment is carried out in a nitrogen atmosphere at 1000° C. for 10 seconds. The n-type lightly doped diffusion layers 53 and 55 perform as source regions, and the n-type lightly doped diffusion layer 54 performs as a drain region.

If the semiconductor device is applied to the semiconductor memory device such as DRAM, diffusion layers are formed for transistors in peripheral circuits. The descriptions for forming the diffusion regions will be omitted because it is not directed to the present invention.

Figure 8:
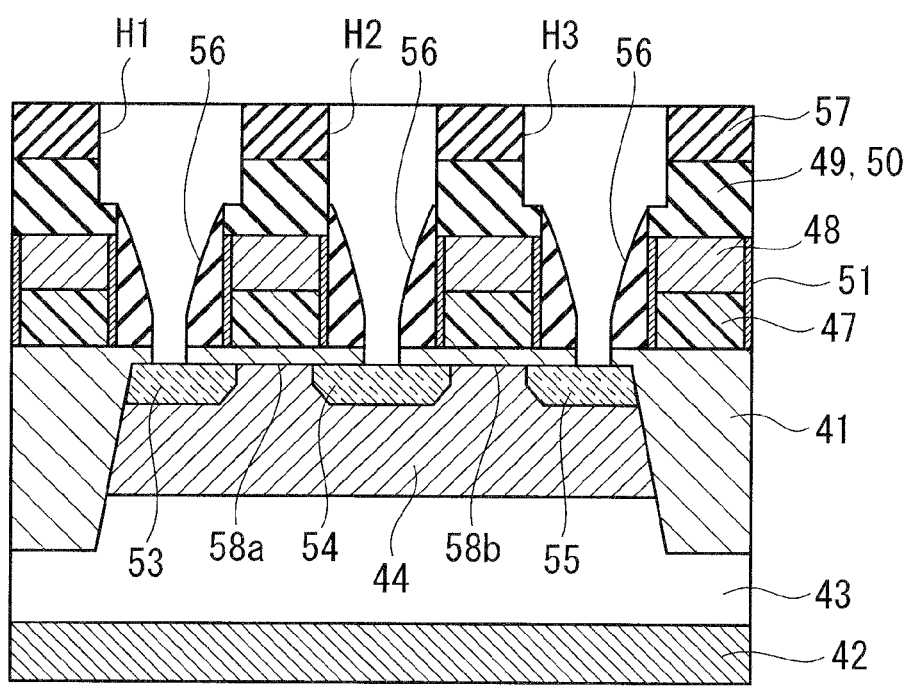
FIG. 8 is a fragmentary cross sectional elevation view illustrating a semiconductor device of in a subsequent step involved in the method of forming the semiconductor device of FIG. 1 in accordance with the first embodiment of the present invention.

As shown in FIG. 8, after the n-type lightly doped diffusion layers 53, 54, and 55 have been formed, a silicon nitride film is formed entirely on the silicon oxide film 52, the silicon oxide films 51, the side walls of the silicon nitride film 49 and the silicon oxide film 50 as well as on the top surfaces of the silicon oxide film 50. The silicon nitride film has a thickness of 30 nanometers. The silicon nitride film is then etched back entirely, thereby forming side wall silicon nitride films 56 on the side walls of the stacked structures. The side wall silicon nitride films 56 are formed on the side walls of the highly phosphorus doped polycrystal silicon film 47 and the silicon oxide film 51 as well as side walls of the lower portion of the silicon nitride film 49. A silicon oxide film 57 is formed entirely which covers the stacked structures and the side wall insulating films 56. The silicon oxide film 57 has a thickness of 300 nanometers. The silicon oxide film 57 is planarized by a chemical mechanical polishing process.

The silicon oxide film 57, the silicon oxide film 50, the silicon nitride film 49, side wall silicon nitride films 56, and the silicon oxide film 52 are selectively and sequentially etched, thereby forming contact holes H1, H2, and H3. The contact hole H1 penetrates the silicon oxide film 57, the silicon oxide film 50, the silicon nitride film 49, side wall silicon nitride films 56, and the silicon oxide film 52, so that the contact hole H1 reaches the n-type lightly doped source diffusion layer 53. The contact hole H2 penetrates the silicon oxide film 57, the silicon oxide film 50, the silicon nitride film 49, side wall silicon nitride films 56, and the silicon oxide film 52, so that the contact hole H2 reaches the n-type lightly doped drain diffusion layer 54. The contact hole H3 penetrates the silicon oxide film 57, the silicon oxide film 50, the silicon nitride film 49, side wall silicon nitride films 56, and the silicon oxide film 52, so that the contact hole H3 reaches the n-type lightly doped source diffusion layer 55.

While the contact holes H1, H2, and H3 are formed, the silicon oxide film 52 is patterned, thereby forming gate insulating films 58a and 58b. The gate insulating film 58a extends over a channel between the n-type lightly doped source and drain diffusion layers 53 and 54. The gate insulating film 58a also extends over parts of the n-type lightly doped source and drain diffusion layers 53 and 54. The gate insulating film 58b extends over another channel between the n-type lightly doped drain and source diffusion layers 54 and 55. The gate insulating film 58b also extends over parts of the n-type lightly doped drain and source diffusion layers 54 and 55.

For the purpose of field relaxation, an ion-implantation process is carried out to introduce phosphorous into the silicon substrate through the contact holes H1, H2, and H3, thereby forming phosphorous-implanted regions. The phosphorous-implanted regions perform as field relaxation regions. The ion-implantation process for field relaxation can be carried out at ion-implantation energy of 30 keV and a dose of $1E13$ $cm^{-2}$. The phosphorous-implanted regions have residual defects. After the ion-implantation process for field relaxation is carried out, a heat treatment is carried out in a nitrogen atmosphere at 950° C. for 10 seconds, so as to reduce residual defects in the phosphorous-implanted regions. Possible reduction of the residual defects in the phosphorous-implanted regions may improve performance of the field relaxation regions. Carrying out the heat treatment after the ion-implantation process for introducing phosphorous can obtain effective field relaxation.

After the heat treatment is carried out, an ion-implantation process is carried out to introduce arsenic into the silicon substrate through the contact holes H1, H2, and H3, thereby forming arsenic-implanted regions. The arsenic-implanted regions reduce the resistance of the n-type lightly doped diffusion layers 53, 54 and 55. The ion-implantation process for reduction of the resistance can be carried out at ion-implantation energy of 20 keV and a dose of $2E13$ $cm^{-2}$. The arsenic-implanted regions have residual defects but only in the vicinity of the surface thereof. The residual defects can be reduced sufficiently by a heat treatment that will be carried out later for forming contact plugs.

Figure 9:
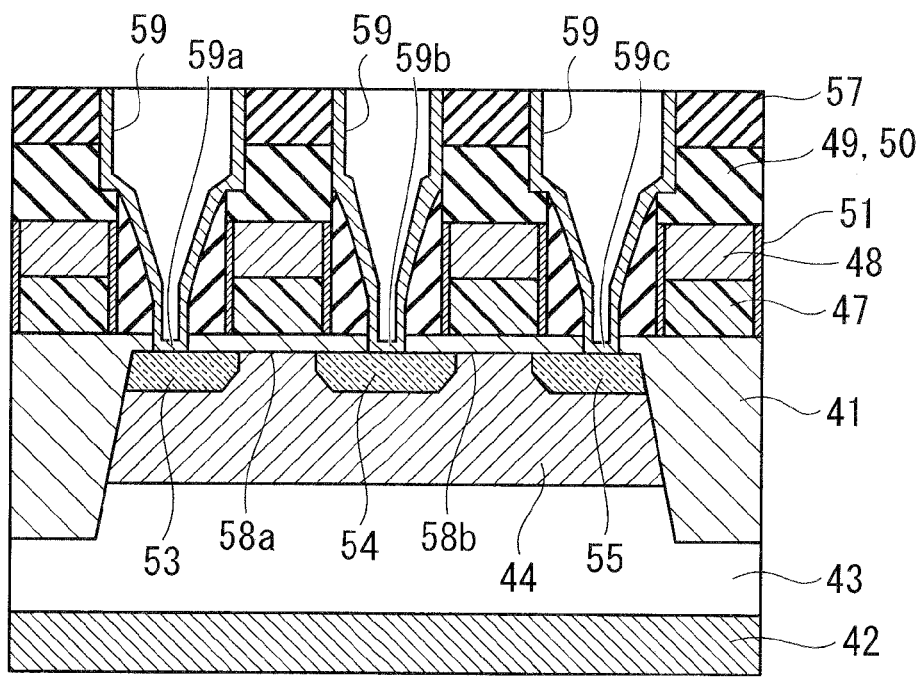
FIG. 9 is a fragmentary cross sectional elevation view illustrating a semiconductor device of in a subsequent step involved in the method of forming the semiconductor device of FIG. 1 in accordance with the first embodiment of the present invention.

As shown in FIG. 9, a wet cleaning process is carried out to clean the contact holes H1, H2, and H3. A phosphorous-doped polycrystal silicon film 59 is formed entirely by a chemical vapor deposition process. The phosphorous-doped polycrystal silicon film 59 has a thickness of 20 nanometers. The phosphorous-doped polycrystal silicon film 59 covers the bottom and side wall of each of the contact holes H1, H2, and H3, as well as covers the top surface of the silicon oxide film 57. The phosphorous-doped polycrystal silicon film 59 contacts with the n-type lightly doped diffusion layers 53, 54 and 55, the gate insulating films 58a and 58b, the side wall silicon nitride films 56, the silicon nitride film 49, the silicon oxide film 50, and the silicon oxide film 57. The phosphorous-doped polycrystal silicon film 59 extending over the top surface of the silicon oxide film 57 is removed by a dry etching process or a chemical mechanical polishing process, while leaving the phosphorous-doped polycrystal silicon film 59 on the bottom and side walls of each of the contact holes H1, H2, and H3.

An ion-implantation process is carried out to introduce germanium (Ge) into the phosphorous-doped polycrystal silicon film 59, thereby forming diffusion barrier layers 59a, 59b, and 59c in the contact holes H1, H2, and H3. The ion-implantation process for introducing germanium (Ge) can be carried out at ion-implantation energy of 20 keV and a dose of $1E14$ $cm^{-2}$. The range in depth of germanium (Ge) is about 15 nanometers under the condition of the ion-implantation energy of 20 keV. The thickness of the phosphorous-doped polycrystal silicon film 59 is 20 nanometers as described above. Thus, germanium (Ge) is implanted into the phosphorous-doped polycrystal silicon film 59, but does not pass through it. Namely, germanium (Ge) is not introduced into the n-type lightly doped diffusion layers 53, 54 and 55. The n-type lightly doped diffusion layers 53, 54 and 55 do not receive any damage by the Ge-implantation process. The reason why germanium (Ge) is not introduced into the n-type lightly doped diffusion layers 53, 54 and 55 is that once ion-implantation damage is introduced into the p-n junction between the n-type lightly doped diffusion layers 53, 54 and 55 and the p-type channel doped layer 44, the damage can cause leakage of junction current. The range in depth of germanium (Ge) should be controlled by the thickness of the phosphorous-doped polycrystal silicon film 59.

The dose of germanium (Ge) ion-implantation is decided such that the concentration of germanium (Ge) is equal to or less than 10% of the atomic density of silicon in the phosphorous-doped polycrystal silicon film 59. If the concentration of germanium (Ge) exceeds 10% of the atomic density of silicon in the phosphorous-doped polycrystal silicon film 59, silicon atoms and germanium atoms are bonded to form silicon germanium (SiGe) compound, namely an SiGe compound layer which contacts with the n-type lightly doped diffusion layers 53, 54 and 55. The SiGe compound layer has a stress which applies a strain to the n-type lightly doped diffusion layers 53, 54 and 55. Application of the stain to the n-type lightly doped diffusion layers 53, 54 and 55 can cause crystal defects such as dislocation in the n-type lightly doped diffusion layers 53, 54 and 55.

Figure 16:
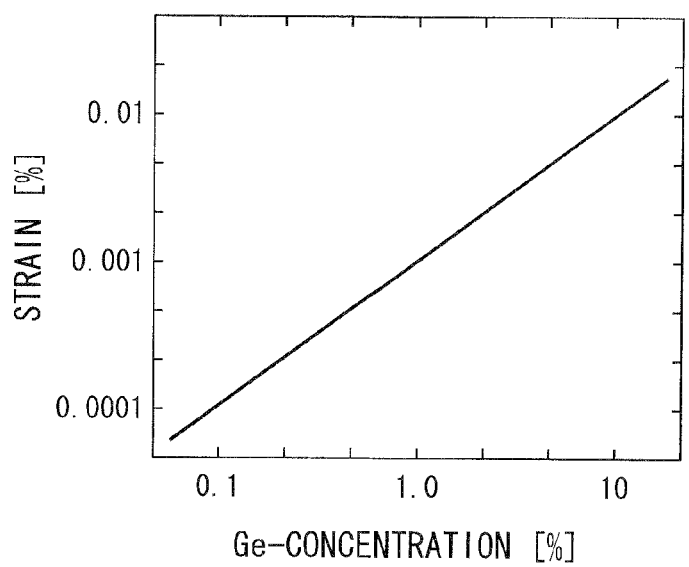
FIG. 16 is a diagram illustrating variation of a strain over germanium concentration, wherein the stain is of a silicon substrate in the vicinity of an interface with a silicon germanium (SiGe) layer which is epitaxially grown on the surface of the silicon substrate, and the germanium concentration is of the silicon germanium (SiGe) layer.

FIG. 16 is a diagram illustrating variation of a strain over germanium concentration, wherein the stain is of a silicon substrate in the vicinity of an interface with a silicon germanium (SiGe) layer which is epitaxially grown on the surface of the silicon substrate, and the germanium concentration is of the silicon germanium (SiGe) layer. The amount of a strain was measured by a convergent-beam-electron-diffraction (CBED-method).

The strain of the silicon substrate in the vicinity of the interface with the silicon germanium (SiGe) layer applies a stress to the silicon germanium (SiGe) epitaxial layer. The stress of the silicon germanium (SiGe) epitaxial layer depends on the germanium concentration thereof. The stress of the silicon germanium (SiGe) epitaxial layer does not depend largely on the method of introducing germanium (SiGe). Therefore, the amount of a strain of the silicon substrate in the vicinity of the silicon germanium (SiGe) epitaxial layer can be evaluated by evaluating epitaxial growth of the silicon germanium (SiGe) epitaxial layer. The silicon germanium (SiGe) epitaxial layer is grown by a reduced chemical vapor deposition process using $SiH_4$ and $GeH_4$ as source gases. As shown in FIG. 16, the stain of the silicon substrate in the vicinity of the silicon germanium (SiGe) epitaxial layer increases as the germanium concentration of the silicon germanium (SiGe) layer is increased. When the germanium concentration of the silicon germanium (SiGe) layer is equal to or greater than $5E21$ $cm^{-3}$, crystal defects such as dislocation may be introduced into the n-type lightly doped diffusion layers 53, 54 and 55 of the silicon substrate.

Figure 10:
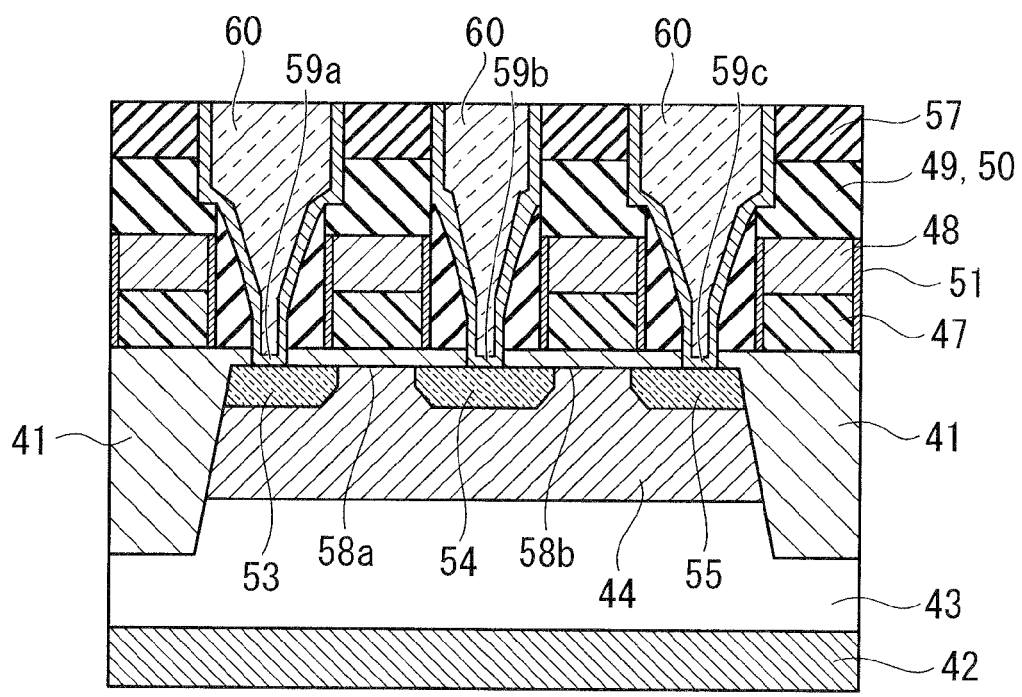
FIG. 10 is a fragmentary cross sectional elevation view illustrating a semiconductor device of in a subsequent step involved in the method of forming the semiconductor device of FIG. 1 in accordance with the first embodiment of the present invention.

As shown in FIG. 10, phosphorous-doped polycrystal silicon contact plugs 60 are formed within the contact holes H1, H2, and H3, so that the phosphorous-doped polycrystal silicon contact plugs 60 fill up the contact holes H1, H2, and H3. The phosphorous-doped polycrystal silicon contact plugs 60 contacts with the diffusion barrier layers 59a, 59b, and 59c in the contact holes H1, H2, and H3. The phosphorous-doped polycrystal silicon contact plugs 60 are separated by the diffusion barrier layers 59a, 59b, and 59c from the n-type lightly doped diffusion layers 53, 54 and 55. The phosphorous-doped polycrystal silicon contact plugs 60 have a high concentration of phosphorus.

The phosphorous-doped polycrystal silicon contact plugs 60 can be formed as follows. A phosphorous-doped polycrystal silicon film is deposited entirely within the contact holes H1, H2, and H3 and over the silicon oxide film 57, wherein the contact holes H1, H2, and H3 have been covered by the diffusion barrier layers 59a, 59b, and 59c, respectively. The phosphorous-doped polycrystal silicon film fills up the contact holes H1, H2, and H3. The phosphorous-doped polycrystal silicon film is then etched back to remove the phosphorous-doped polycrystal silicon film over the silicon oxide film 57, while leaving the phosphorous-doped polycrystal silicon film within the contact holes H1, H2, and H3. As a result, the phosphorous-doped polycrystal silicon contact plugs 60 are formed on the diffusion barrier layers 59a, 59b, and 59c in the contact holes H1, H2, and H3.

Figure 11:
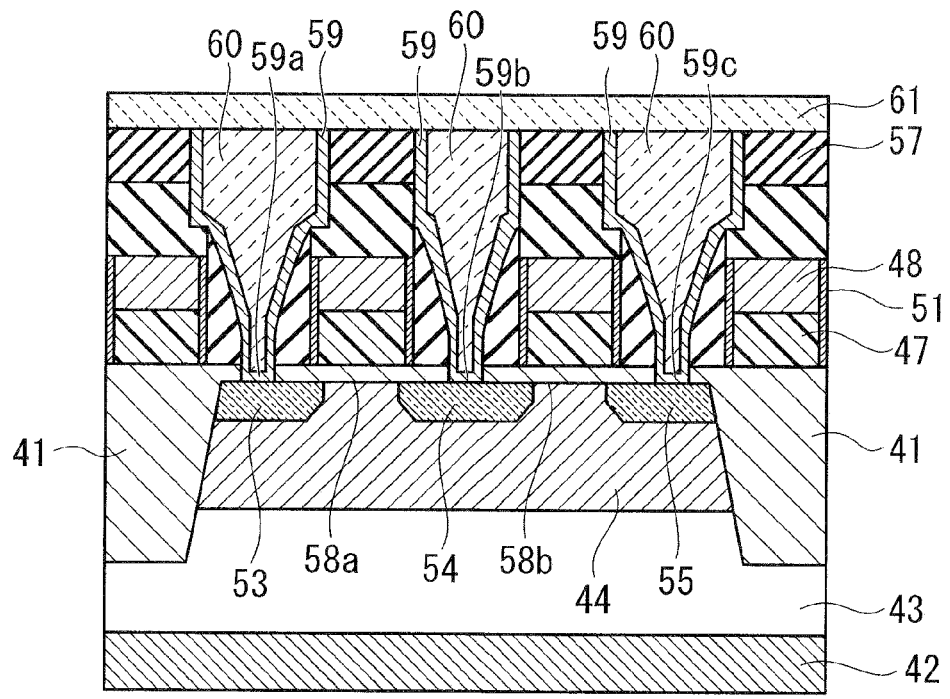
FIG. 11 is a fragmentary cross sectional elevation view illustrating a semiconductor device of in a subsequent step involved in the method of forming the semiconductor device of FIG. 1 in accordance with the first embodiment of the present invention.

As shown in FIG. 11, a silicon oxide film 61 is formed over the silicon oxide film 57, and the phosphorous-doped polycrystal silicon contact plugs 60. The silicon oxide film 61 has a thickness of 100 nanometers. After the silicon oxide film 61 is formed, a heat treatment is carried out in a nitrogen atmosphere at 950° C. for 10 seconds.

Inter-layer insulators, contact holes, contact plugs, and bit lines, and capacitive structures are formed in the know processes, thereby forming a DRAM cell structure as shown in FIG. 1.

Figure 12:
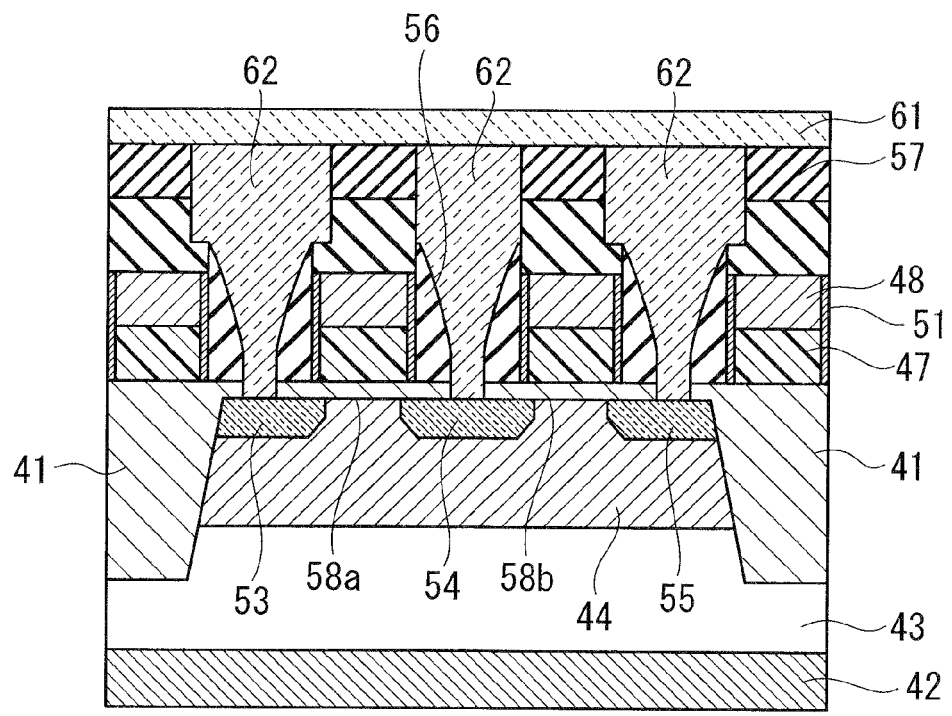
FIG. 12 is a fragmentary cross sectional elevation view illustrating a conventional semiconductor device in a comparative example.

FIG. 12 is a fragmentary cross sectional elevation view illustrating a conventional semiconductor device in a comparative example. The conventional semiconductor device is free of any diffusion barrier layer which separates a polycrystal silicon plug from a diffusion layer in a semiconductor substrate. Namely, the conventional semiconductor device is structurally different from the semiconductor device of FIG. 11 in that the conventional semiconductor device is free of the diffusion barrier layers 59a, 59b and 59c. Polycrystal silicon contact plugs 62 are formed in the contact holes H1, H2, and H3. The polycrystal silicon contact plugs 62 contacts directly with the bottom and side walls of the contact holes H1, H2, and H3. The polycrystal silicon contact plugs 62 contacts directly with the n-type lightly doped diffusion layers 53, 54 and 55.

Figure 17:
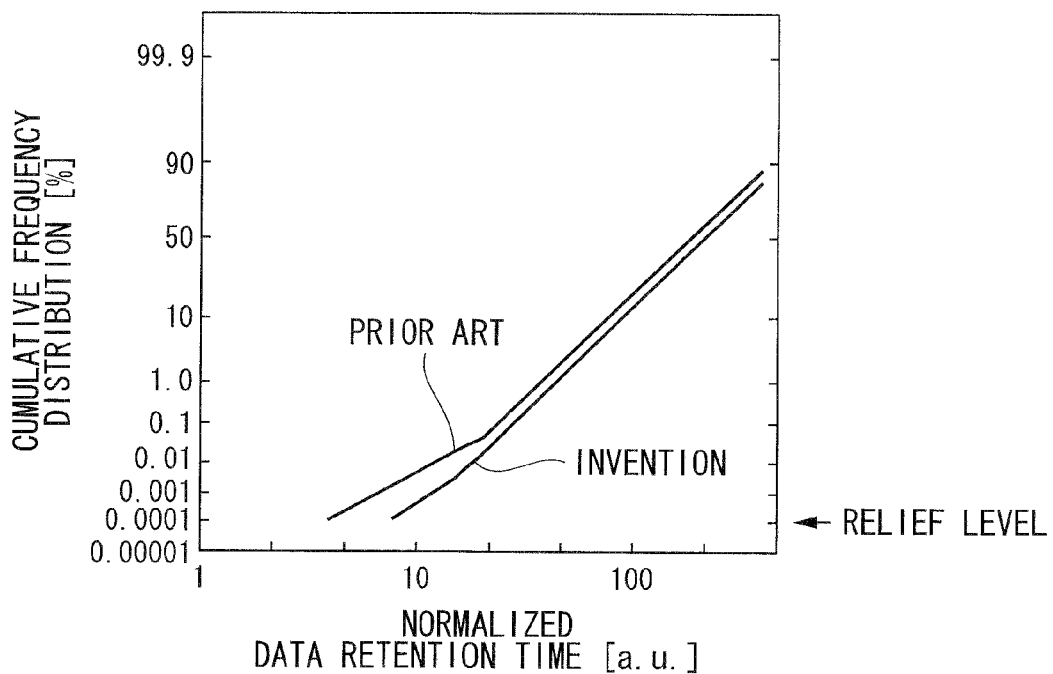
FIG. 17 is a diagram illustrating variation of cumulative frequency distribution over normalized data retention time for each of the semiconductor device of the present invention and the conventional semiconductor device of FIG. 12.

Tests for data retention time were carried out for both the semiconductor device of the present invention and the conventional semiconductor device of FIG. 12. FIG. 17 is a diagram illustrating variation of cumulative frequency distribution over normalized data retention time for each of the semiconductor device of the present invention and the conventional semiconductor device of FIG. 12. Data retention time was measured for all bits of a 512M DRAM chip at the operation voltage and a temperature of 85° C., wherein the 512M DRAM chip includes the diffusion barrier layers and was fabricated in accordance with the present invention. Data retention time was also measured for all bits of a conventional 512M DRAM chip at the operation voltage and the temperature of 85° C., wherein the conventional 512M DRAM chip is free of any diffusion barrier layer. The data retention time at the relief level and the cumulative frequency distribution of 0.0001% is the characteristic of the 512M DRAM. The 512M DRAM is longer in data retention time than the conventional 512M DRAM. Namely, the diffusion barrier layers improve the data retention time characteristic of the 512M DRAM.

As described above, the phosphorous-doped polycrystal silicon contact plugs 60 are separated by the diffusion barrier layers 59a, 59b and 59c from the n-type lightly doped diffusion layers 53, 54 and 55. The diffusion barrier layer 59a can prevent that silicon-interstitial in the n-type lightly doped diffusion layer 53 is diffused into the phosphorous-doped polycrystal silicon contact plugs 60 during the heat treatment at 900° C. for 10 minutes so as to activate phosphorus in the polycrystal silicon. The diffusion barrier layer 59a can also prevent diffusion of vacancy-type defects into the n-type lightly doped diffusion layer 53 during the heat treatment at 900° C. for 10 minutes so as to activate phosphorus in the polycrystal silicon.

The diffusion layer 59b can prevent that silicon-interstitial in the n-type lightly doped diffusion layer 54 is diffused into the phosphorous-doped polycrystal silicon contact plugs 60 during the heat treatment at 900° C. for 10 minutes so as to activate phosphorus in the polycrystal silicon. The diffusion barrier layer 59b can also prevent diffusion of vacancy-type defects into the n-type lightly doped diffusion layer 54 during the heat treatment at 900° C. for 10 minutes so as to activate phosphorus in the polycrystal silicon.

The diffusion layer 59c can prevent that silicon interstitial in the n-type lightly doped diffusion layer 55 is diffused into the phosphorous-doped polycrystal silicon contact plugs 60 during the heat treatment at 900° C. for 10 minutes so as to activate phosphorus in the polycrystal silicon. The diffusion barrier layer 59c can also prevent diffusion of vacancy-type defects into the n-type lightly doped diffusion layer 55 during the heat treatment at 900° C. for 10 minutes so as to activate phosphorus in the polycrystal silicon.

The diffusion barrier layers 59a, 59b, and 59c can be formed by introducing germanium (Ge) into the phosphorous-doped polycrystal silicon film 59 as described above. In other case, the diffusion barrier layers 59a, 59b, and 59c can be formed by a chemical vapor deposition process for depositing silicon germanium (SiGe).

In still other case, it is possible to introduce silicon-interstitial into the phosphorous-doped polycrystal silicon film 59, instead of introducing germanium (Ge). The diffusion barrier layers 59a, 59b, and 59c can be formed by introducing silicon ions into the phosphorous-doped polycrystal silicon film 59 at a dose in the range of 1E13 $cm^{-2}$ to 1E15 $cm^{-2}$. Silicon-interstitial is introduced into the phosphorous-doped polycrystal silicon film 59 to form the diffusion barrier layers 59a, 59b, and 59c.

Figure 18:
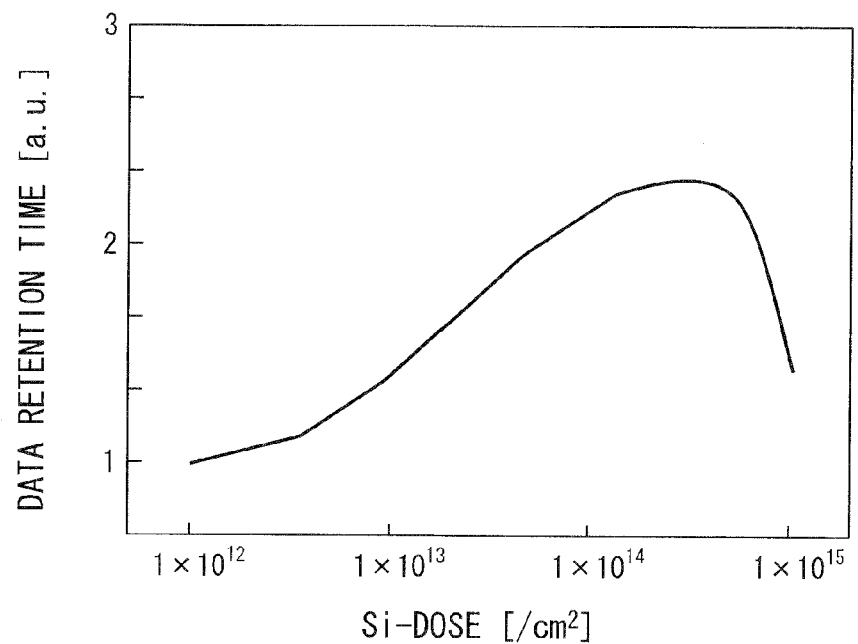
FIG. 18 is a diagram illustrating variation of data retention time over Si-dose for each of the semiconductor device of the last-mentioned modified embodiment of the present invention and the conventional semiconductor device of FIG. 12.

Tests for data retention time were also carried out for both the semiconductor device of the last-mentioned modified embodiment of the present invention and the conventional semiconductor device of FIG. 12. FIG. 18 is a diagram illustrating variation of data retention time over Si-dose for each of the semiconductor device of the last-mentioned modified embodiment of the present invention and the conventional semiconductor device of FIG. 12. Data retention time was measured for all bits of a 512M DRAM chip at the operation voltage and a temperature of 85° C., wherein the 512M DRAM chip includes the Si-doped diffusion barrier layers and was fabricated in accordance with the last-mentioned modified embodiment of the present invention. The measured data retention time at the relief level of 0.0001% varies depending upon the Si-dose. In the range of Si-dose from 1E13 $cm^{-2}$ to 1E15 $cm^{-2}$, a sufficient data retention time characteristic can be ensured. In order for the 512M DRAM chip to have the sufficient data retention time characteristic, the range of Si-dose from 1E13 $cm^{-2}$ to 1E15 $cm^{-2}$ is preferable.

It is possible to introduce an element that is larger in covalent radius than silicon (Si) into the phosphorous-doped polycrystal silicon film 59. Typical examples of the elements that are larger in covalent radius than silicon are germanium (Ge), arsenic (As), indium (In), tin (Sn), and antimony (Sb). One or more elements larger in covalent radius than silicon may be contained in polycrystal silicon of the diffusion barrier layer. It can be possible to select one or more elements in view of improving the performance of the transistor.

Figure 13:
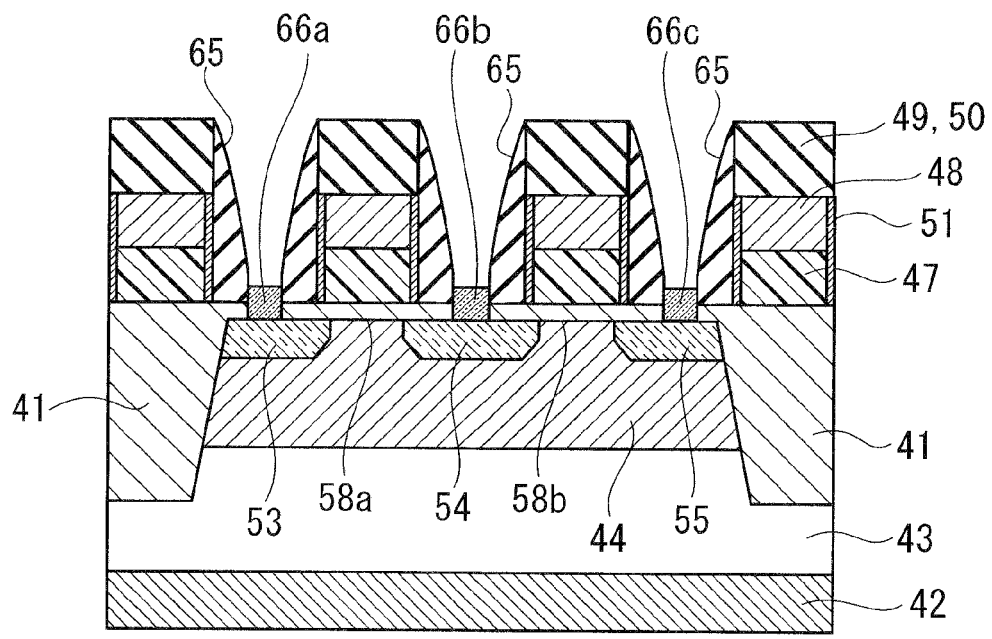
FIG. 13 is a fragmentary cross sectional elevation view illustrating a semiconductor device of in a sequential step involved in a method of forming the semiconductor device of FIG. 15 in accordance with the second embodiment of the present invention.
Figure 14:
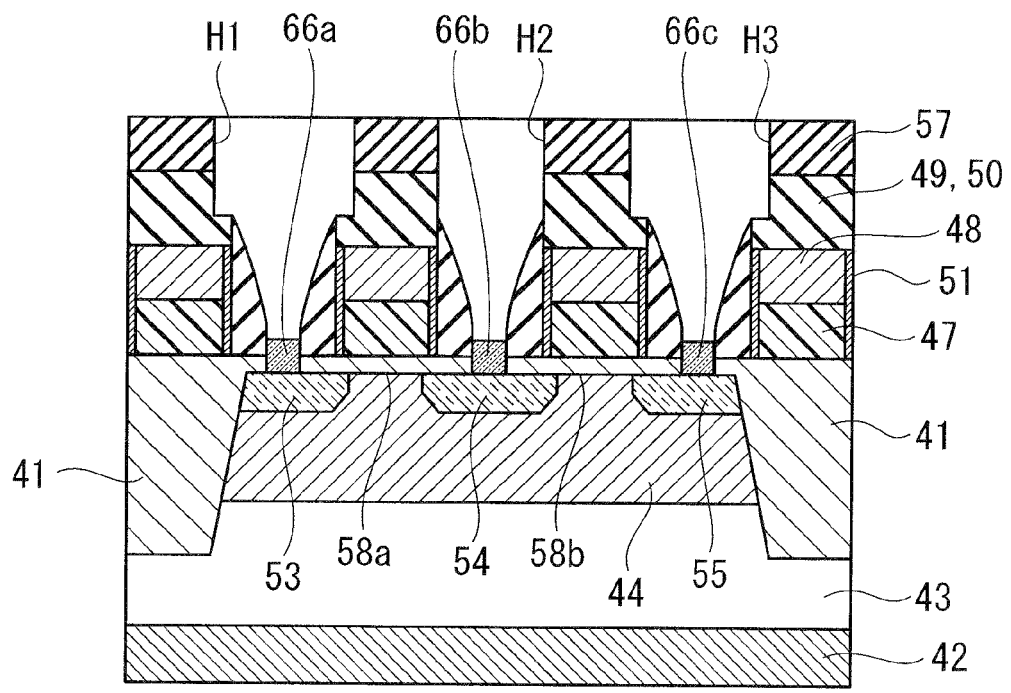
FIG. 14 is a fragmentary cross sectional elevation view illustrating a semiconductor device of in a sequential step involved in a method of forming the semiconductor device of FIG. 15 in accordance with the second embodiment of the present invention.
Figure 15:
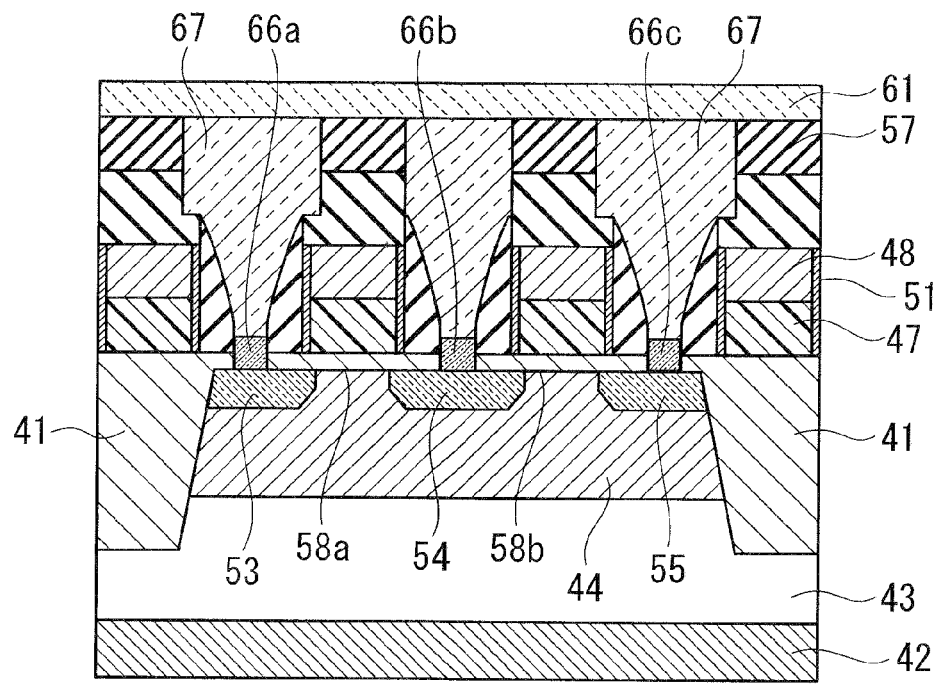
FIG. 15 is a fragmentary cross sectional elevation view illustrating a semiconductor device of in a sequential step involved in a method of forming the semiconductor device of FIG. 15 in accordance with the second embodiment of the present invention.

FIGS. 13 through 15 are fragmentary cross sectional elevation views illustrating semiconductor devices of in sequential steps involved in a method of forming the semiconductor device of FIG. 15 in accordance with the second embodiment of the present invention. The same processes as the above-described processes of FIGS. 3 to 8 are carried out.

As shown in FIG. 13, after the n-type lightly doped diffusion layers 53, 54, and 55 have been formed, a silicon nitride film is formed entirely on the silicon oxide film 52, the silicon oxide films 51, the side walls of the silicon nitride film 49 and the silicon oxide film 50 as well as on the top surfaces of the silicon oxide film 50. The silicon nitride film is then etched back entirely, thereby forming side wall silicon nitride films 65 on the side walls of the stacked structures. The side wall silicon nitride films 65 are formed on the side walls of the highly phosphorus doped polycrystal silicon film 47 and the silicon oxide film 51 as well as side walls of the lower portion of the silicon nitride film 49 and the silicon oxide film 50.

While the contact holes H1, H2, and H3 are formed, the silicon oxide film 52 is patterned, thereby forming gate insulating films 58a and 58b. The gate insulating film 58a extends over a channel between the n-type lightly doped source and drain diffusion layers 53 and 54. The gate insulating film 58a also extends over parts of the n-type lightly doped source and drain diffusion layers 53 and 54. The gate insulating film 58b extends over another channel between the n-type lightly doped drain and source diffusion layers 54 and 55. The gate insulating film 58b also extends over parts of the n-type lightly doped drain and source diffusion layers 54 and 55.

A selective epitaxial growth is carried out to form single crystal silicon films 66a, 66b, and 66c on exposed surfaces of the n-type lightly doped diffusion layers 53, 54, and 55. Namely, the single crystal silicon films 66a, 66b, and 66c are formed on the bottoms of the contact holes H1, H2, and H3. Before the single crystal silicon films 66a, 66b, and 66c are formed, a cleaning process is carried out for cleaning the exposed surfaces of the n-type lightly doped diffusion layers 53, 54, and 55. The cleaning process can be carried out by a plasma etching process in an oxygen atmosphere or by a hydrogen baking process.

After the cleaning process is carried out, the selective epitaxial growth process can be carried out using dichlorosilane ($SiH_2Cl_2$) and hydrochloric acid (HCl) at a temperature in the range of 750° C. to 900° C. under a vacuum pressure of about 15 Torr. An ion-implantation process is carried out to introduce germanium (Ge) into the single crystal silicon films 66a, 66b, and 66c. The ion-implantation process for introducing germanium (Ge) can be carried out at ion-implantation energy of 20 keV and a dose of 1E14 $cm^{-2}$.

A heat treatment is carried out at a temperature in the range of 800° C. to 900° C. so as to recover the damages given by the ion-implantation in the single crystal silicon films 66a, 66b, and 66c, so that the single crystal silicon films 66a, 66b, and 66c becomes free of any substantive damage and become able to perform as diffusion barrier layers 66a, 66b, and 66c. An ion-implantation process is carried out to introduce phosphorus into the diffusion barrier layers 66a, 66b, and 66c. The ion-implantation process for introducing phosphorus can be carried out at ion-implantation energy of 20 keV and a dose of 1E13 $cm^{-2}$.

If germanium (Ge) and phosphorus (P) are simultaneously introduced into the single crystal silicon films 66a, 66b, and 66c, then the dose is too high to recover the damages given by the ion-implantation. Therefore, germanium (Ge) and phosphorus (P) are introduced by different or separate ion-implantation processes.

As shown in FIG. 14, a silicon oxide film 57 is formed over the silicon oxide film 50 and on the side wall silicon nitride films 65 as well as over the diffusion barrier layers 66a, 66b, and 66c. The surface of the silicon oxide film 57 is planarized by a chemical mechanical polishing method. A lithography process and a dry etching process are carried out to form contact holes H1, H2, and H3. The contact holes H1, H2, and H3 reach the diffusion barrier layers 66a, 66b, and 66c, respectively. In other words, the top surfaces of the diffusion barrier layers 66a, 66b, and 66c are shown under the contact holes H1, H2, and H3, respectively.

As shown in FIG. 15, phosphorous-doped polycrystal silicon contact plugs 67 are formed within the contact holes H1, H2, and H3, so that the phosphorous-doped polycrystal silicon contact plugs 67 fill up the contact holes H1, H2, and H3. The phosphorous-doped polycrystal silicon contact plugs 67 contacts with the diffusion barrier layers 66a, 66b, and 66c in the contact holes H1, H2, and H3. The phosphorous-doped polycrystal silicon contact plugs 67 are separated by the diffusion barrier layers 66a, 66b, and 66c from the n-type lightly doped diffusion layers 53, 54 and 55.

The phosphorous-doped polycrystal silicon contact plugs 67 can be formed as follows. A phosphorous-doped polycrystal silicon film is deposited entirely within the contact holes H1, H2, and H3 and over the silicon oxide film 57. The phosphorous-doped polycrystal silicon film fills up the contact holes H1, H2, and H3. The phosphorous-doped polycrystal silicon film is then etched back to remove the phosphorous-doped polycrystal silicon film over the silicon oxide film 57, while leaving the phosphorous-doped polycrystal silicon film within the contact holes H1, H2, and H3. As a result, the phosphorous-doped polycrystal silicon contact plugs 67 are formed on the diffusion barrier layers 66a, 66b, and 66c in the contact holes H1, H2, and H3. A heat treatment is carried out at 900° C. for 10 seconds for the purpose of activating phosphorous.

Figure 19:
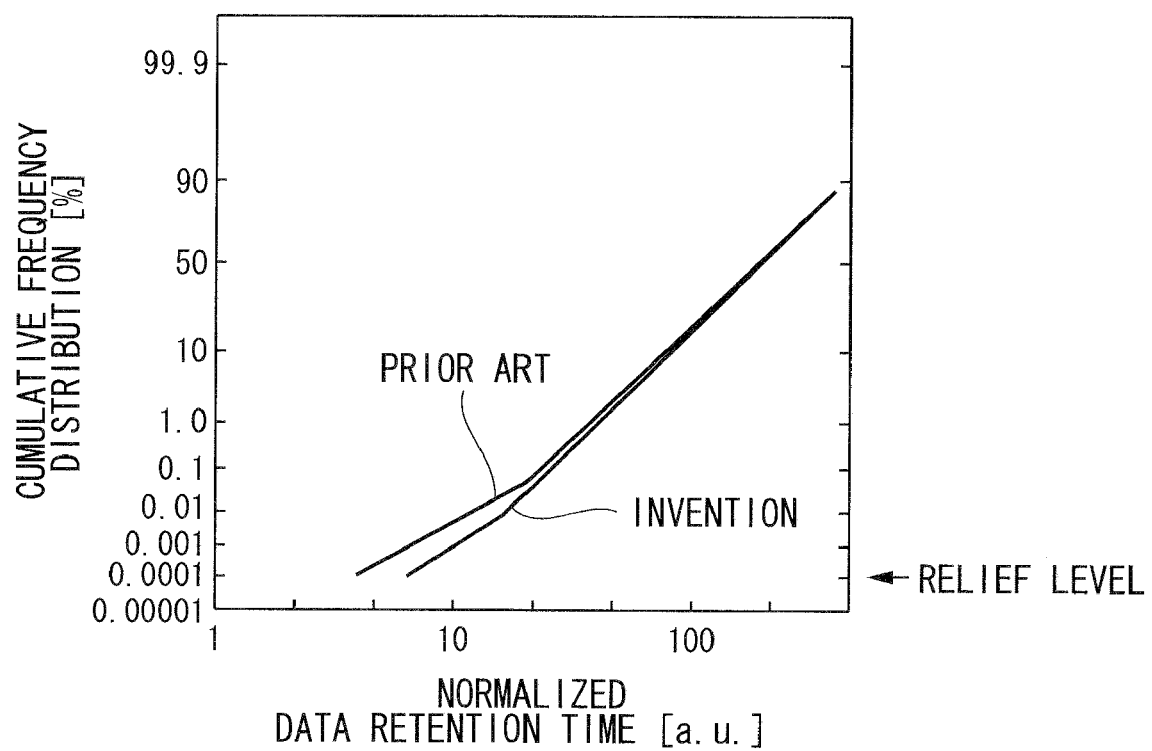
FIG. 19 is a diagram illustrating variation of cumulative frequency distribution over normalized data retention time for each of the semiconductor device of the second embodiment of the present invention and the conventional semiconductor device of FIG. 12.
Figure 20:
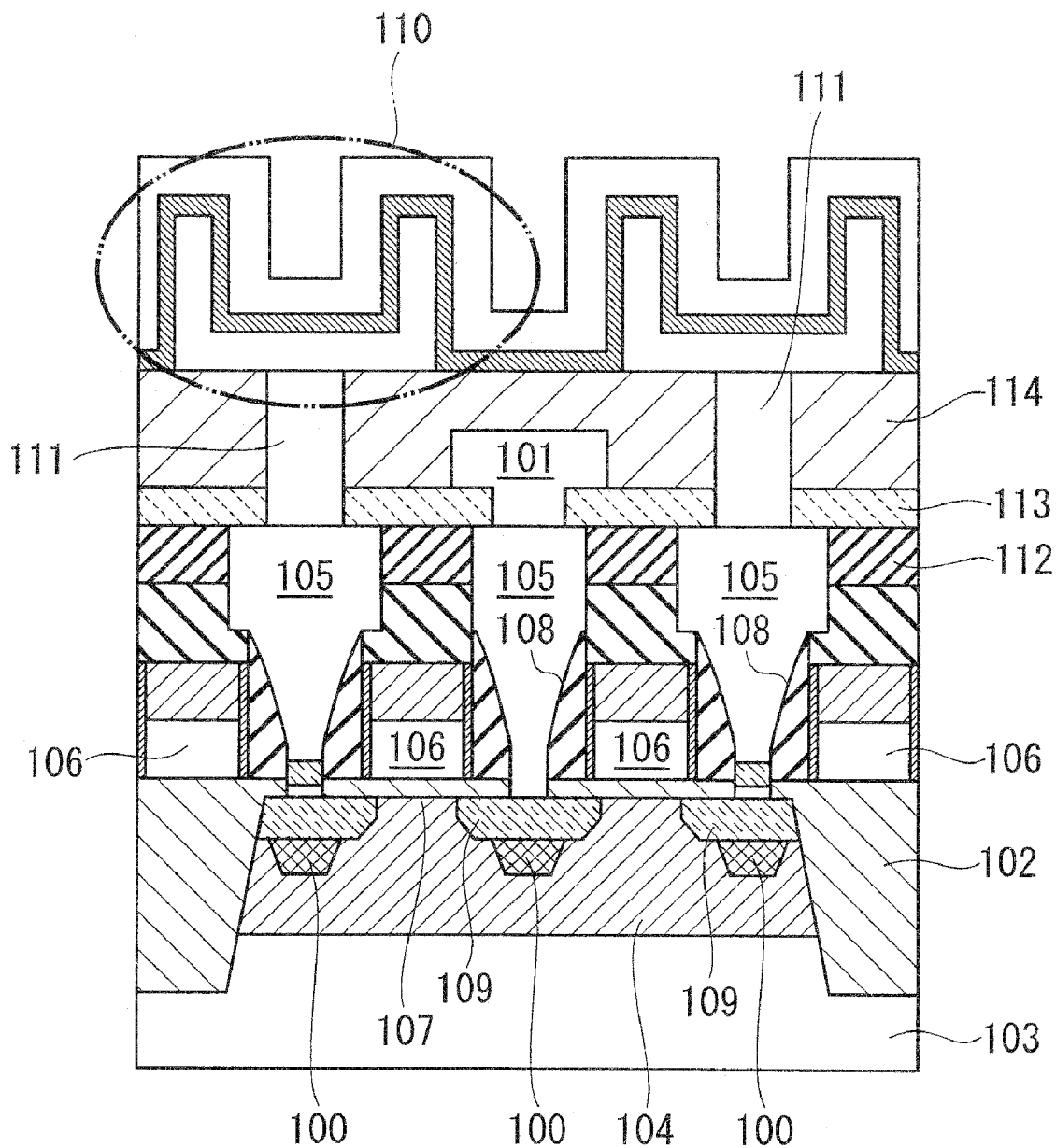
FIG. 20 is a fragmentary cross sectional elevation view illustrating a conventional structure of a memory cell transistor in a semiconductor memory device, such as a DRAM.
Figure 21:
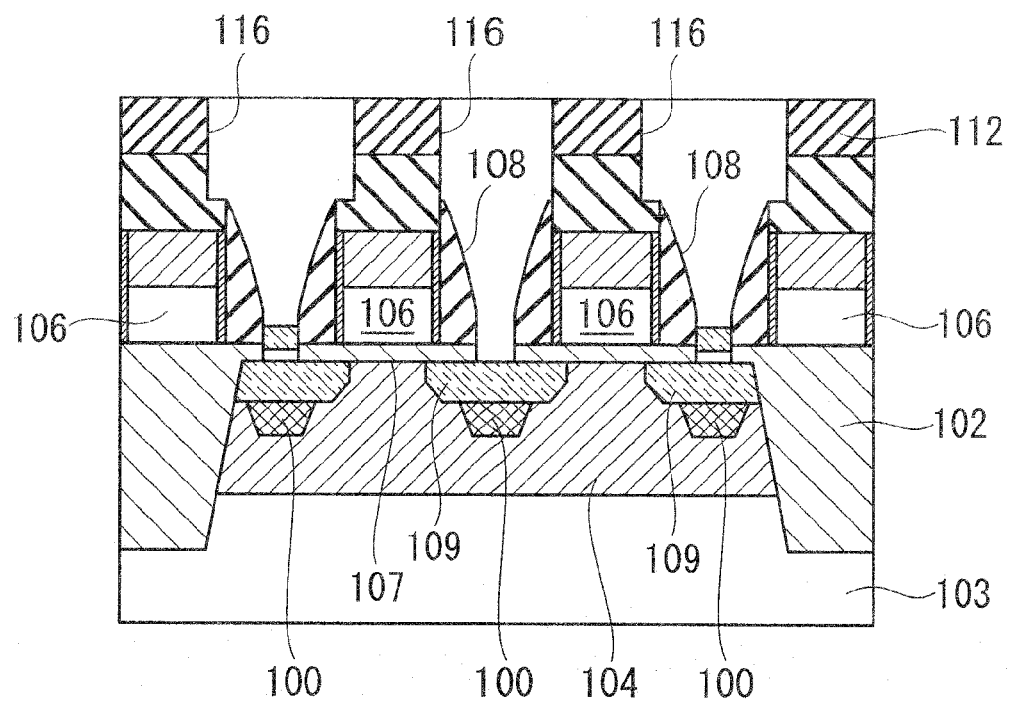
FIG. 21 is a fragmentary cross sectional elevation view illustrating a conventional cell transistor structure that is included in the conventional semiconductor device of FIG. 20.
Figure 22:
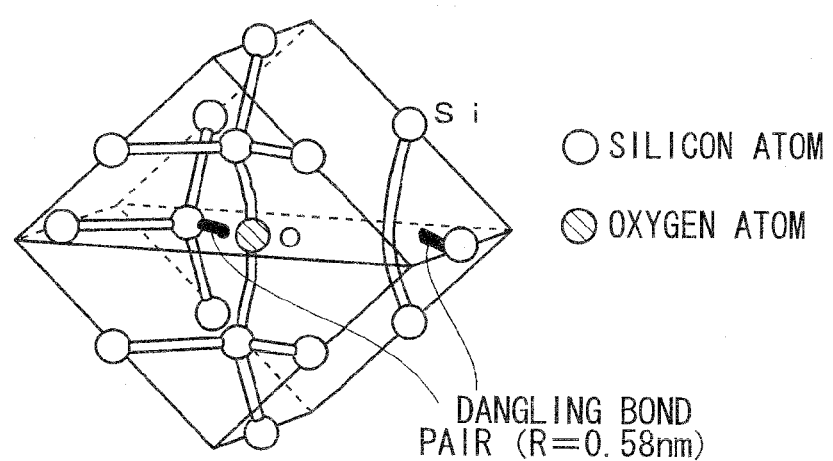
FIG. 22 is a diagram illustrating a crystal structure model with vacancy-type defects.
Figure 23:
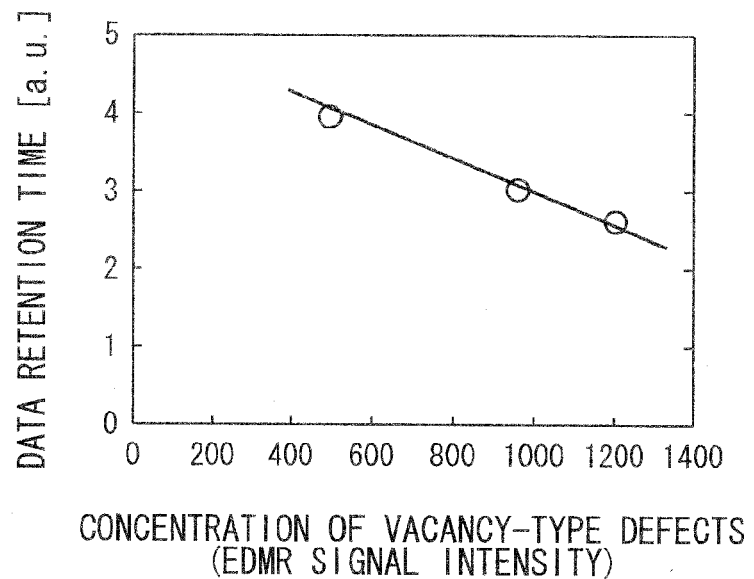
FIG. 23 is a diagram illustrating dependency of data retention time of DRAM upon the concentration of vacancy-type defects.
Figure 24:
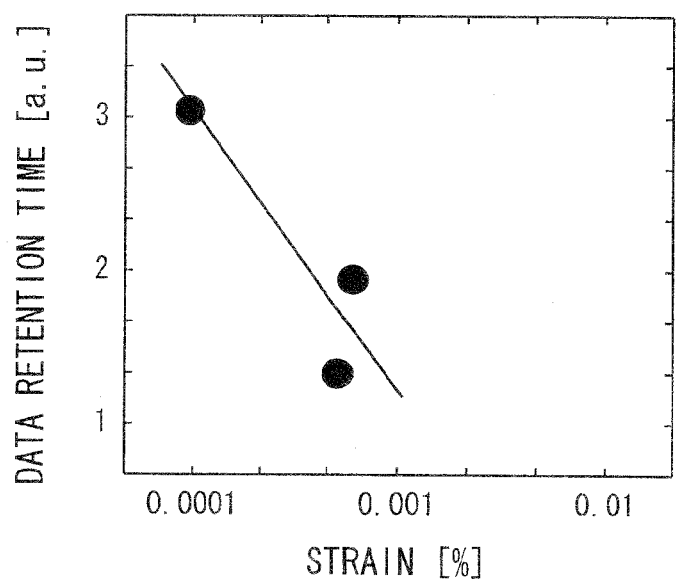
FIG. 24 is a diagram illustrating the dependency of data retention time upon compressive strain of a depletion layer of the DRAM cell transistor.
Figure 25A:
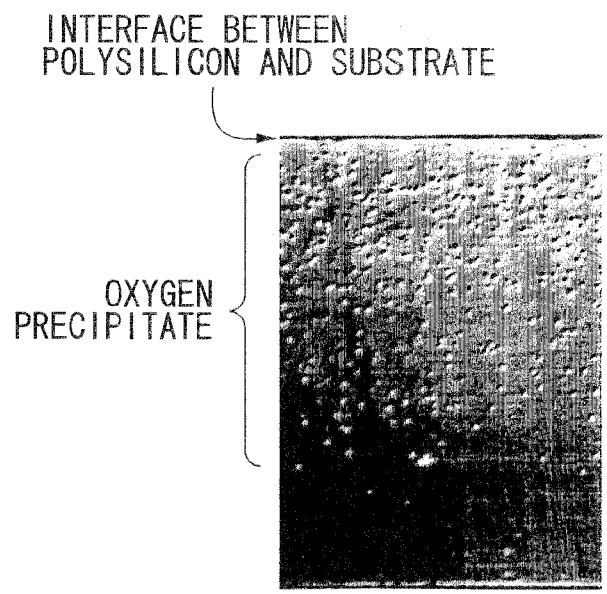
FIG. 25A is a photograph showing a cross section of a silicon substrate having an interface with a polysilicon film that extends over the silicon substrate.
Figure 25B:
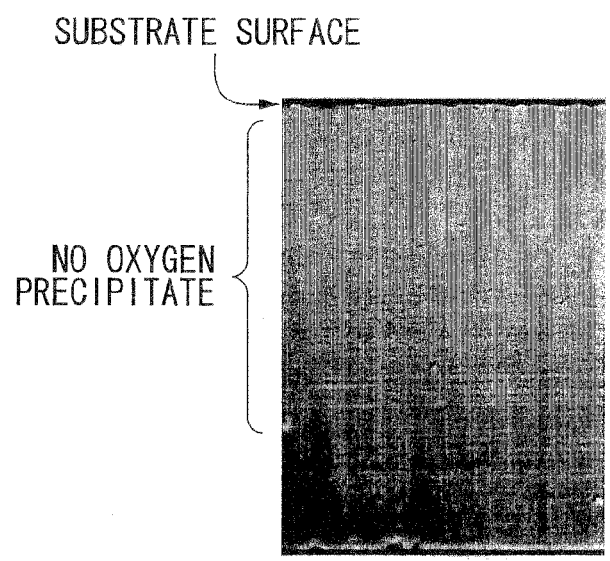
FIG. 25B is a photograph showing a cross section of a silicon substrate having an exposed surface, free of any polysilicon film.
Figure 25C:
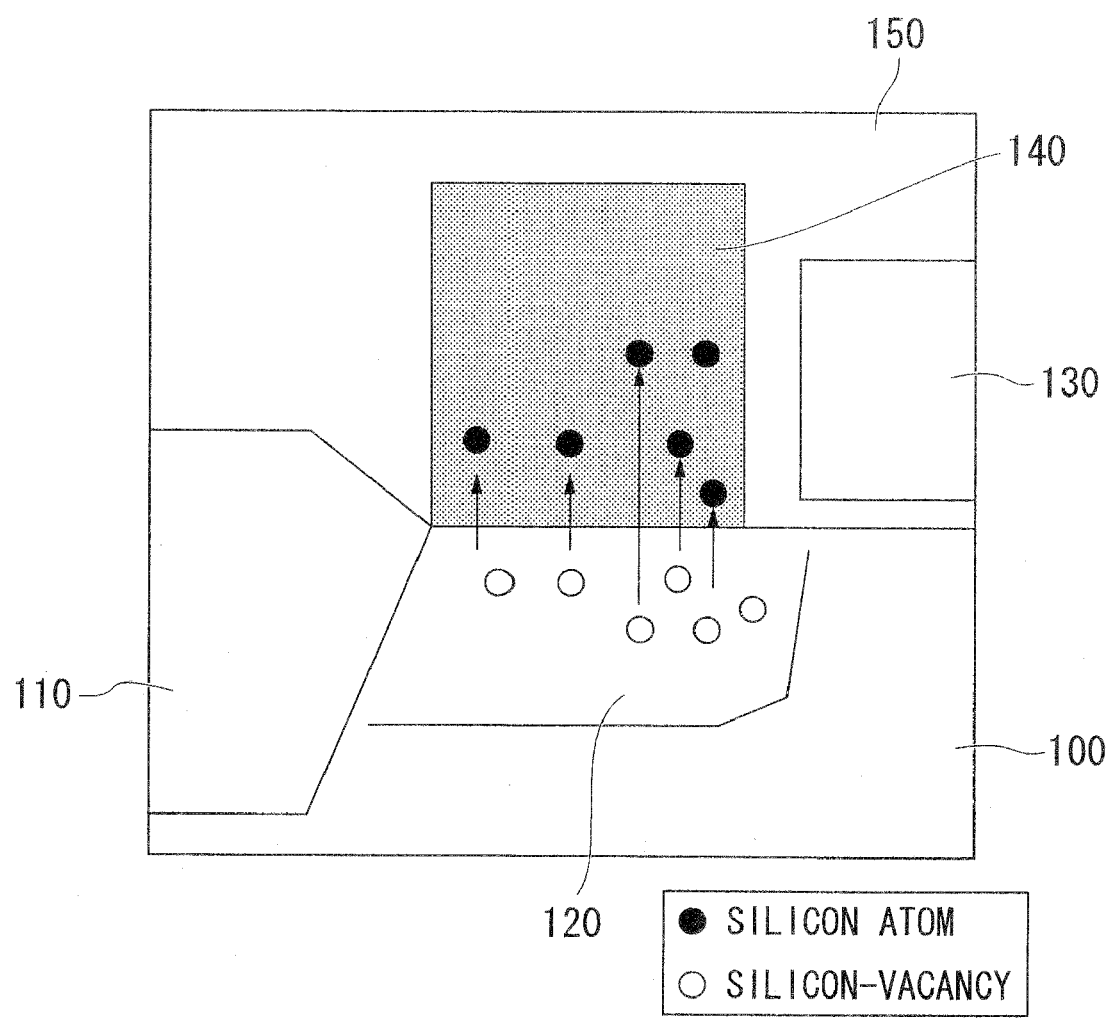
FIG. 25C is a diagram illustrating the mechanism of generating vacancy-type defects in a single crystal structure of silicon by heat treatment.

Tests for data retention time were carried out for both the semiconductor device of the second embodiment of the present invention and the conventional semiconductor device of FIG. 12. FIG. 19 is a diagram illustrating variation of cumulative frequency distribution over normalized data retention time for each of the semiconductor device of the second embodiment of the present invention and the conventional semiconductor device of FIG. 12. Data retention time was measured for all bits of a 512M DRAM chip at the operation voltage and a temperature of 85° C., wherein the 512M DRAM chip includes the diffusion barrier layers and was fabricated in accordance with the second embodiment of the present invention. Data retention time was also measured for all bits of the conventional 512M DRAM chip at the operation voltage and the temperature of 85° C., wherein the conventional 512M DRAM chip is free of any diffusion barrier layer. The data retention time at the relief level and the cumulative frequency distribution of 0.0001% is the characteristic of the 512M DRAM. The 512M DRAM is longer in data retention time than the conventional 512M DRAM. Namely, the diffusion barrier layers improve the data retention time characteristic of the 512M DRAM.

As described above, the phosphorous-doped polycrystal silicon contact plugs 67 are separated by the diffusion barrier layers 66a, 66b and 66c from the n-type lightly doped diffusion layers 53, 54 and 55. The diffusion barrier layer 66a can prevent that silicon-interstitial in the n-type lightly doped diffusion layer 53 is diffused into the phosphorous-doped polycrystal silicon contact plugs 67 during the heat treatment at 900° C. for 10 minutes so as to activate phosphorus in the polycrystal silicon. The diffusion barrier layer 66a can also prevent diffusion of vacancy-type defects into the n-type lightly doped diffusion layer 53 during the heat treatment at 900° C. for 10 minutes so as to activate phosphorus in the polycrystal silicon.

The diffusion layer 66b can prevent that silicon-interstitial in the n-type lightly doped diffusion layer 54 is diffused into the phosphorous-doped polycrystal silicon contact plugs 67 during the heat treatment at 900° C. for 10 minutes so as to activate phosphorus in the polycrystal silicon. The diffusion barrier layer 66b can also prevent diffusion of vacancy-type defects into the n-type lightly doped diffusion layer 54 during the heat treatment at 900° C. for 10 minutes so as to activate phosphorus in the polycrystal silicon.

The diffusion layer 66c can prevent that silicon-interstitial in the n-type lightly doped diffusion layer 55 is diffused into the phosphorous-doped polycrystal silicon contact plugs 67 during the heat treatment at 900° C. for 10 minutes so as to activate phosphorus in the polycrystal silicon. The diffusion barrier layer 66c can also prevent diffusion of vacancy-type defects into the n-type lightly doped diffusion layer 55 during the heat treatment at 900° C. for 10 minutes so as to activate phosphorus in the polycrystal silicon.

The diffusion barrier layers that separate the contact plugs from the diffusion layers can improve the data retention time characteristic for the semiconductor memory device such as the DRAM, thereby allowing that a refresh cycle is set longer. Longer refresh cycle can reduce the consumption of power that need to charge and discharge for information. If the semiconductor device is applied to SRAMs, it is possible to reduce the stand-by current, thereby reducing the power consumption. The semiconductor device that is designed to be reduced in power consumption can also be applicable to terminal devices or other devices that are designed to operate under high temperature conditions.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device, comprising:
    a single crystal silicon diffusion layer;
    a polycrystal silicon conductor; and
    a diffusion barrier layer that separates the polycrystal silicon conductor from the single crystal silicon diffusion layer, the diffusion barrier layer preventing a diffusion of at least one of silicon-interstitial and silicon-vacancy between the single crystal silicon diffusion layer and the polycrystal silicon conductor,
    wherein the diffusion barrier layer comprises at least one of polycrystal and single crystal silicon films having implanted silicon ions at a dose in the range of 1E13 $cm^{-2}$ to 1E15 $cm^{-2}$, and the at least one of polycrystal and single crystal silicon films contains silicon-interstitial or nitrogen-interstial.

2. The semiconductor device according to claim 1, wherein the polycrystal silicon conductor has an impurity concentration in the range of $1E20$ cm$^{-3}$ to $1E21$ cm$^{-3}$.

3. The semiconductor device according to claim 1, wherein the polycrystal silicon conductor is a polycrystal silicon contact plug that is provided in a contact hole which reaches at least a part of the single crystal silicon diffusion layer, and the diffusion barrier layer is provided at least on the bottom of the contact hole.

4. The semiconductor device according to claim 3, wherein the diffusion barrier layer covers the side wall and bottom of the contact hole.

5. The semiconductor device according to claim 1, wherein the polycrystal silicon contact plug contains phosphorus.

6. The semiconductor device according to claim 1, wherein the diffusion is a thermal diffusion during a heat treatment.

7. The semiconductor device according to claim 1, wherein the single crystal silicon diffusion layer is a source or drain diffusion layer of a MOS transistor, and the semiconductor device is a semiconductor memory device and the MOS transistor is a memory cell transistor.

8. A method of forming a semiconductor device, the method comprising:
    forming a single crystal silicon diffusion layer in a semiconductor substrate;
    forming an insulating layer over the semiconductor substrate;
    forming a contact hole in the insulating layer, the contact hole reaching at least a part of the single crystal silicon diffusion layer;
    forming a diffusion barrier layer comprising at least one of a polycrystal film and a single crystal silicon film in the contact hole, the diffusion barrier layer covering the at least part of the single crystal silicon diffusion layer;
    implanting silicon ions to the diffusion barrier layer at a dose in the range of $1E13$ cm$^{-2}$ to $1E15$ cm$^{-2}$; and
    forming a polycrystal silicon contact plug in the contact hole, the diffusion barrier layer separating the polycrystal silicon contact plug from the single crystal silicon diffusion layer, the diffusion barrier layer preventing a diffusion of at least one of silicon-interstitial and silicon-vacancy between the single crystal silicon diffusion layer and the polycrystal silicon contact plug.

9. The method according to claim 8, wherein the polycrystal silicon contact plug has an impurity concentration in the range of $1E20$ cm$^{-3}$ to $1E21$ cm$^{-3}$.

10. The method according to claim 8, wherein the diffusion barrier layer is formed at least on the bottom of the contact hole.

11. The method according to claim 10, wherein the diffusion barrier layer covers the side wall and bottom of the contact hole.

12. The method according to claim 8, wherein the polycrystal silicon contact plug contains phosphorus.

13. The method according to claim 12, further comprising:
    carrying out a heat treatment to activate phosphorus in the polycrystal silicon contact plug, while the diffusion barrier layer preventing a thermal diffusion of the at least one of silicon-interstitial and silicon-vacancy between the single crystal silicon diffusion layer and the polycrystal silicon contact plug.

14. A semiconductor device comprising:
    a single crystal silicon diffusion layer;
    a polycrystal silicon conductor; and
    a diffusion barrier layer that separates the polycrystal silicon conductor from the single crystal silicon diffusion layer,
    wherein the diffusion barrier layer comprises one of a polycrystal film and a single crystal silicon film, and the diffusion barrier layer includes at least an element which is selected from germanium (Ge), indium (In), tin (Sn) and antimony (Sb).

15. The semiconductor device according to claim 14, wherein the polycrystal silicon conductor includes phosphorus having an impurity concentration in the range of $1E20$ cm$^{-3}$ to $1E21$ cm$^{-3}$.

16. The semiconductor device according to claim 14, wherein the polycrystal silicon conductor is a polycrystal silicon contact plug that is provided in a contact hole which reaches at least a part of the single crystal silicon diffusion layer.

17. The semiconductor device according to claim 16, wherein the diffusion barrier layer is disposed between a bottom surface of the polycrystal silicon contact plug and a top surface of the single crystal silicon diffusion layer.

18. The semiconductor device according to claim 16, wherein the diffusion barrier layer is contacted with both a side surface of the polycrystal silicon contact plug and a bottom surface of the polycrystal silicon contact plug.

* * * * *